US010411126B2

(12) United States Patent
Riegler et al.

(10) Patent No.: US 10,411,126 B2
(45) Date of Patent: Sep. 10, 2019

(54) SEMICONDUCTOR DEVICE HAVING A FIRST THROUGH CONTACT STRUCTURE IN OHMIC CONTACT WITH THE GATE ELECTRODE

(71) Applicant: Infineon Technologies Austria AG, Villach (AT)

(72) Inventors: Andreas Riegler, Lichtpold (AT); Christian Fachmann, Fuernitz (AT); Gabor Mezoesi, Villach (AT); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/153,037

(22) Filed: Oct. 5, 2018

(65) Prior Publication Data
US 2019/0051742 A1  Feb. 14, 2019

Related U.S. Application Data

(63) Continuation-in-part of application No. 15/944,948, filed on Apr. 4, 2018.

(51) Int. Cl.
*H01L 29/08* (2006.01)
*H01L 29/78* (2006.01)
(Continued)

(52) U.S. Cl.
CPC ........ *H01L 29/781* (2013.01); *H01L 21/2253* (2013.01); *H01L 21/266* (2013.01);
(Continued)

(58) Field of Classification Search
CPC ............ H01L 29/0878; H01L 29/1095; H01L 29/42312; H01L 29/41766; H01L 29/66712; H01L 29/7811; H01L 29/7827
See application file for complete search history.

(56) References Cited

U.S. PATENT DOCUMENTS

2005/0161785 A1  7/2005  Kawashima et al.
2008/0017897 A1*  1/2008  Saito ................... H01L 23/3192
257/288

(Continued)

FOREIGN PATENT DOCUMENTS

DE   102004052153 A1   4/2006
DE   102013204252 A1   9/2013

*Primary Examiner* — Hoai V Pham
(74) *Attorney, Agent, or Firm* — Murphy, Bilak & Homiller, PLLC

(57) ABSTRACT

A semiconductor device includes an electrically conductive lead frame which includes a die pad and a plurality of electrically conductive leads, each of the leads in the plurality being spaced apart from the die pad. The semiconductor device further includes first and second integrated switching devices mounted on the die pad, each of the first and second integrated switching devices include electrically conductive gate, source and drain terminals. The source terminal of the first integrated switching device is disposed on a rear surface of the first integrated switching device that faces and electrically connects with the die pad. The drain terminal of the second integrated switching device is disposed on a rear surface of the second integrated switching device that faces and electrically connects with the die pad.

11 Claims, 25 Drawing Sheets

(51) Int. Cl.
    *H01L 21/78*         (2006.01)
    *H01L 23/495*      (2006.01)
    *H01L 29/10*         (2006.01)
    *H01L 29/06*         (2006.01)
    *H01L 29/66*         (2006.01)
    *H01L 21/265*      (2006.01)
    *H01L 21/266*      (2006.01)
    *H01L 21/324*      (2006.01)
    *H01L 21/225*      (2006.01)
    *H01L 21/304*      (2006.01)
    *H01L 23/31*         (2006.01)

(52) U.S. Cl.
    CPC ...... *H01L 21/26513* (2013.01); *H01L 21/304* (2013.01); *H01L 21/324* (2013.01); *H01L 21/78* (2013.01); *H01L 23/4952* (2013.01); *H01L 23/49503* (2013.01); *H01L 23/49562* (2013.01); *H01L 23/49575* (2013.01); *H01L 29/0634* (2013.01); *H01L 29/0638* (2013.01); *H01L 29/1095* (2013.01); *H01L 29/66712* (2013.01); *H01L 23/3107* (2013.01); *H01L 2224/48091* (2013.01); *H01L 2224/48247* (2013.01); *H01L 2224/73265* (2013.01)

(56) References Cited

U.S. PATENT DOCUMENTS

2012/0146130 A1    6/2012   Hirler et al.
2012/0289003 A1   11/2012   Hirler et al.
2014/0063744 A1    3/2014   Lopez et al.

\* cited by examiner

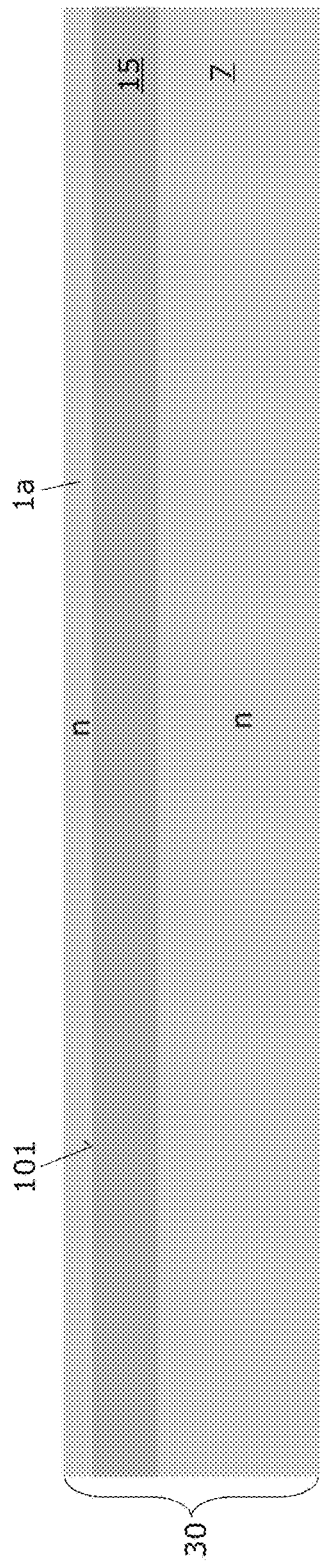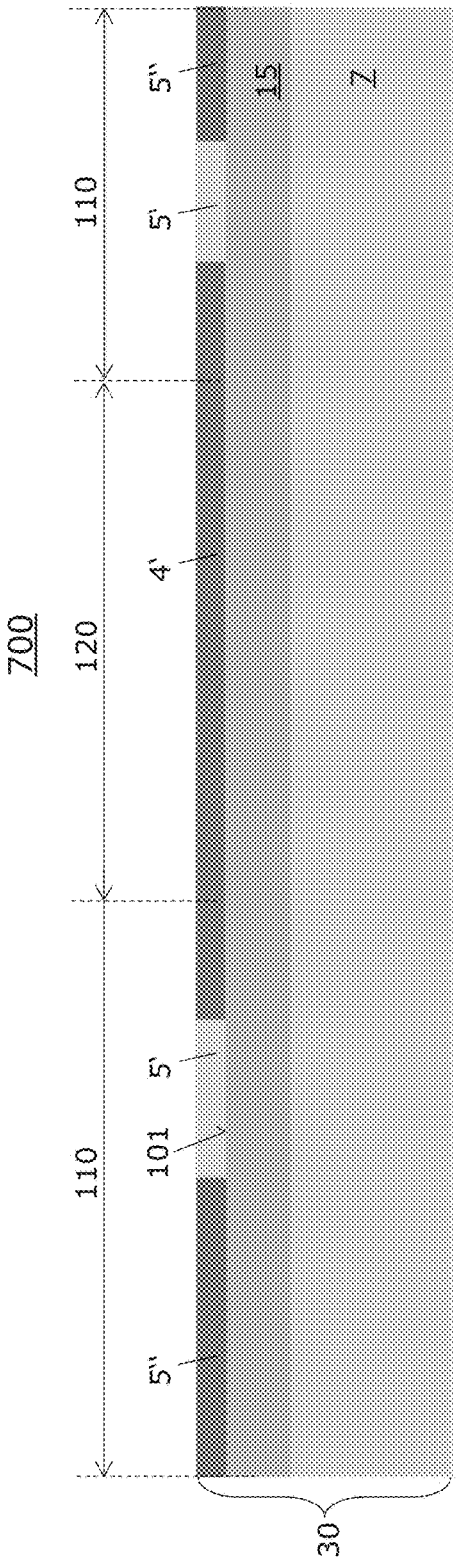
FIG 7A
FIG 7B

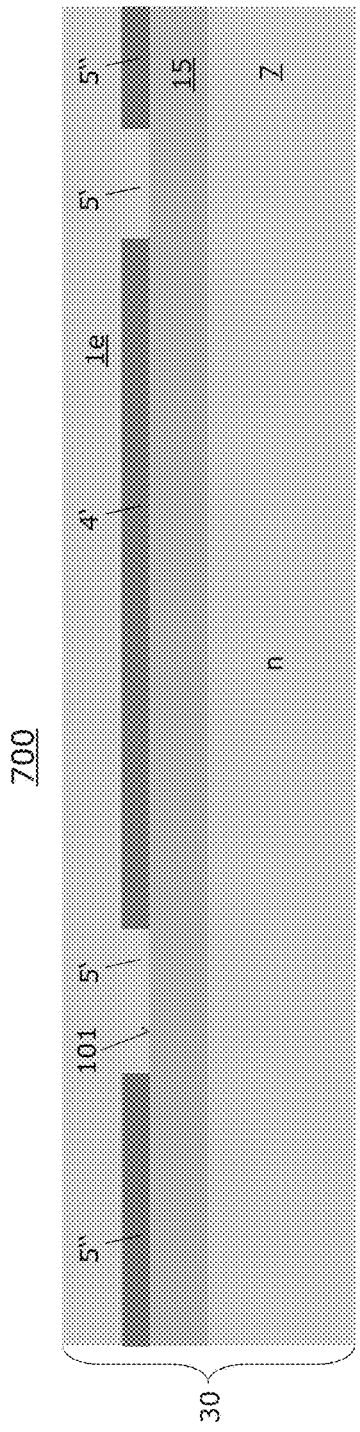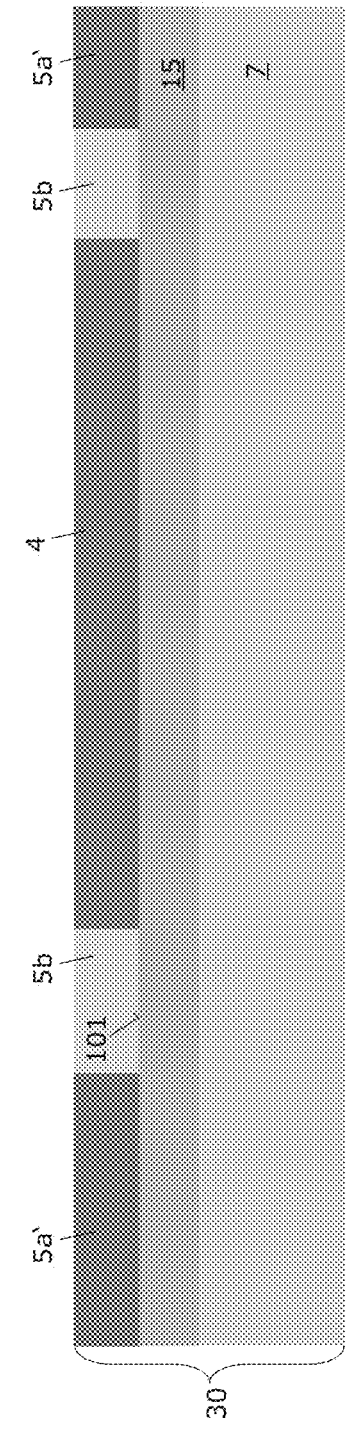

SEMICONDUCTOR DEVICE HAVING A FIRST THROUGH CONTACT STRUCTURE IN OHMIC CONTACT WITH THE GATE ELECTRODE

RELATED APPLICATIONS

This application is a continuation in part of U.S. patent application Ser. No. 15/944,948 filed on Apr. 4, 2018, which claims priority to DE application number 10 2017 107 327.2 filed Apr. 5, 2017, the entire contents of which are incorporated herein by reference.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, a low on-state resistance Ron and high breakdown voltages $U_{bd}$ are often desired.

To achieve low on-state resistance Ron and high breakdown voltages $U_{bd}$, charge-compensation semiconductor devices were developed. The compensation principle is based on a mutual compensation of charges in n- and p-doped regions, which are often also referred to as n- and p-doped pillar regions, in the drift zone of a vertical MOSFET.

Typically, the charge-compensation structure formed by p-type and n-type regions is arranged below the actual MOSFET-structure, with its source, body regions and gate regions, and also below the associated MOS-channels that are arranged next to one another in the semiconductor volume of the semiconductor device or interleaved with one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components, which results in a significant reduction of the on-state resistance Ron despite the loss of a current-carrying area. The reduction of the on-state resistance Ron of such semiconductor power devices is associated with a reduction of the heat generated by the current in the on-state, so that such semiconductor power devices with charge-compensation structure remain "cool" compared with conventional semiconductor power devices.

Many power semiconductor devices including charge-compensation devices are usually designed as vertically conducting devices and have an active area (cell area) surrounded by a peripheral area. Accordingly, the electric current in the on state flows from the source on the front side to drain at the backside of the chip. The backside is often implemented as a "common-drain", i.e. as an equipotential surface at drain potential.

However, there are applications which are better suited for common-source devices, i.e. to devices with one side implemented as an equipotential surface at source potential during device operation, or a combination of a common-source device with a common-drain device. Example refer to automotive applications and the integration of two semiconductor chips such as a power semiconductor field-effect transistor chip and a driver chip for the transistor chip or two power semiconductor field-effect transistor chips of a half-bridge or a synchronous rectifier circuitry into a common package.

Also due to similar voltage of gate and source structures during operation, these structures are often located in immediate "neighborhood" to each other and are processed from the same wafer side, namely the front side. However, if the wafer front side should represent a common source plane, the gate connection must be rewired to the wafer back side. Particularly in the case of high-voltage components (e.g. having a blocking voltage of at least one hundred volt), an edge-termination structure may than be required on the chip rear side (or in terms of production technology on the wafer back side). Unfortunately, the structuring and processing options are rather limited on the back of the wafer compared to the front side. Accordingly, it is often difficult to achieve sufficiently high blocking voltages for those devices, at least in a cost-efficient manner. Moreover, the rewiring of the gate connection through the bulk may also have an impact on the electric field distribution during device operation.

Accordingly, there is a need to improve field-effect semiconductor devices, in particular power field-effect semiconductor devices including charge-compensation field-effect semiconductor devices and manufacturing of those semiconductor devices.

SUMMARY

According to an embodiment of a field-effect semiconductor device, the field-effect semiconductor device includes a semiconductor body including a first side, a second side opposite the first side, an n-type drift region, a p-type body layer forming a pn-junction with the drift region and arranged at the second side, and a p-type field-stop region in Ohmic connection with the body layer. A source metallization is arranged on the second side and in Ohmic connection with the body layer. A drain metallization is arranged on the first side and in Ohmic connection with the drift region. A gate electrode is arranged adjacent to the second side and electrically insulated from the semiconductor body to define an operable switchable channel region in the body layer for providing an Ohmic connection between the source metallization and the drift region. A first through contact structure extends at least between the first side and the second side, and includes a conductive region in Ohmic connection with the gate electrode, and a dielectric layer electrically insulating the conductive region from the semiconductor body. A gate metallization is arranged on the first side and in Ohmic connection with the conductive region. In a normal projection onto a horizontal plane at least substantially parallel to the first side, the field-stop region surrounds at least one of the drift region and the gate electrode.

According to an embodiment of a field-effect semiconductor device, the field-effect semiconductor device includes a semiconductor body including a first side, a second side opposite the first side, a semiconductor structure of a second conductivity type extending at least substantially from the first side to the second side, and a drift region of a first conductivity type arranged, in a vertical cross-section at least substantially perpendicular to the first side, between two portions of the semiconductor structure. A first metallization is arranged on the second side and in Ohmic connection with the semiconductor structure. A second metallization is arranged on the first side and in Ohmic connection with the drift region. A plurality of gate electrodes arranged adjacent to the second side overlap with the drift region in a normal projection onto a horizontal plane at least substantially parallel to the first side, and are electrically insulated from the semiconductor body. A first through contact structure extends at least between the first side and the second side, and includes a conductive region in Ohmic connection with the gate electrodes, and a dielectric layer electrically insulating the conductive region from the semiconductor body so that at least a portion of the semiconductor structure is, in the normal projection onto the horizontal plane, arranged between the first through contact structure and the gate electrodes. A gate pad is arranged on the first side and in Ohmic connection with the conductive region.

According to an embodiment of a method for forming a field-effect semiconductor device, the method includes providing a wafer including a semiconductor body including a first side, a second side opposite the first side, a drift region of a first conductivity type and a semiconductor structure of a second conductivity type extending from the first side to the second side, and surrounding the drift region in a normal projection onto a horizontal plane at least substantially parallel to the first side, and a first dielectric layer arranged at the first side. A first deep trench is formed from the second side at least to the dielectric layer. A dielectric sidewall layer is formed at a sidewall of the first deep trench. A conductive region is formed at the sidewall layer in the first deep trench. A plurality of gate electrodes is formed adjacent to the second side and overlapping with the drift region in the normal projection onto the horizontal plane. A first metallization is formed on the second side and in Ohmic connection with the semiconductor structure. Opposite to the first metallization, a second metallization in Ohmic connection with the drift region, and a gate metallization in Ohmic connection with the conductive region are formed.

According to an embodiment of a semiconductor device, the semiconductor device includes an electrically conductive lead frame which includes a die pad and a plurality of electrically conductive leads, each of the leads in the plurality being spaced apart from the die pad. The semiconductor device further includes first and second integrated switching devices mounted on the die pad, each of the first and second integrated switching devices having electrically conductive gate, source and drain terminals. The source terminal of the first integrated switching device is disposed on a rear surface of the first integrated switching device that faces and electrically connects with the die pad. The drain terminal of the second integrated switching device is disposed on a rear surface of the second integrated switching device that faces and electrically connects with the die pad. The gate and drain terminals of the first integrated switching device are disposed on a main surface of the first integrated switching device that is opposite from the die pad. The first integrated switching device comprises a first semiconductor body. The first semiconductor body includes a first side that is opposite from the die pad, a second side that faces the die pad, a drift region, a body region that forms a p-n junction with the drift region, a gate electrode disposed at the second side and being configured to provide an electrically conductive connection between the source terminal and the drift region, and a first through contact structure extending between the first and second sides of the first semiconductor body and comprising a conductive region in Ohmic connection with the gate electrode and the gate terminal.

According to another embodiment of a semiconductor device, the semiconductor device includes an electrically conductive lead frame which includes a die pad and a plurality of electrically conductive leads, each of the leads in the plurality being spaced apart from the die pad. The semiconductor device further includes a half bridge circuit comprising a high-side switch, a low-side switch, and a center tap node connected between a drain terminal of the high-side switch and a source terminal of the low-side switch. The high-side switch and the low-side switch are each provided by discrete semiconductor dies being mounted on the die pad. The die pad provides the center tap node of the half bridge circuit. The high-side switch includes a first semiconductor body having a first side that is opposite from the die pad and a second side that faces the die pad, the first semiconductor body includes a gate electrode disposed at the second side and a first through contact structure in ohmic contact with the gate electrode extending between the first and second sides of the first semiconductor body.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 7A to FIG. 7B, FIG. 8A to FIG. 8B, and FIG. 9 to FIG. 21 illustrate vertical cross-sections through a semiconductor body during method steps of methods according to embodiments.

FIG. 25A illustrates a plan view of the half-bridge circuit before encapsulation. FIG. 25B illustrates an isometric view of the half-bridge circuit after encapsulation.

DETAILED DESCRIPTION

Figure 1:
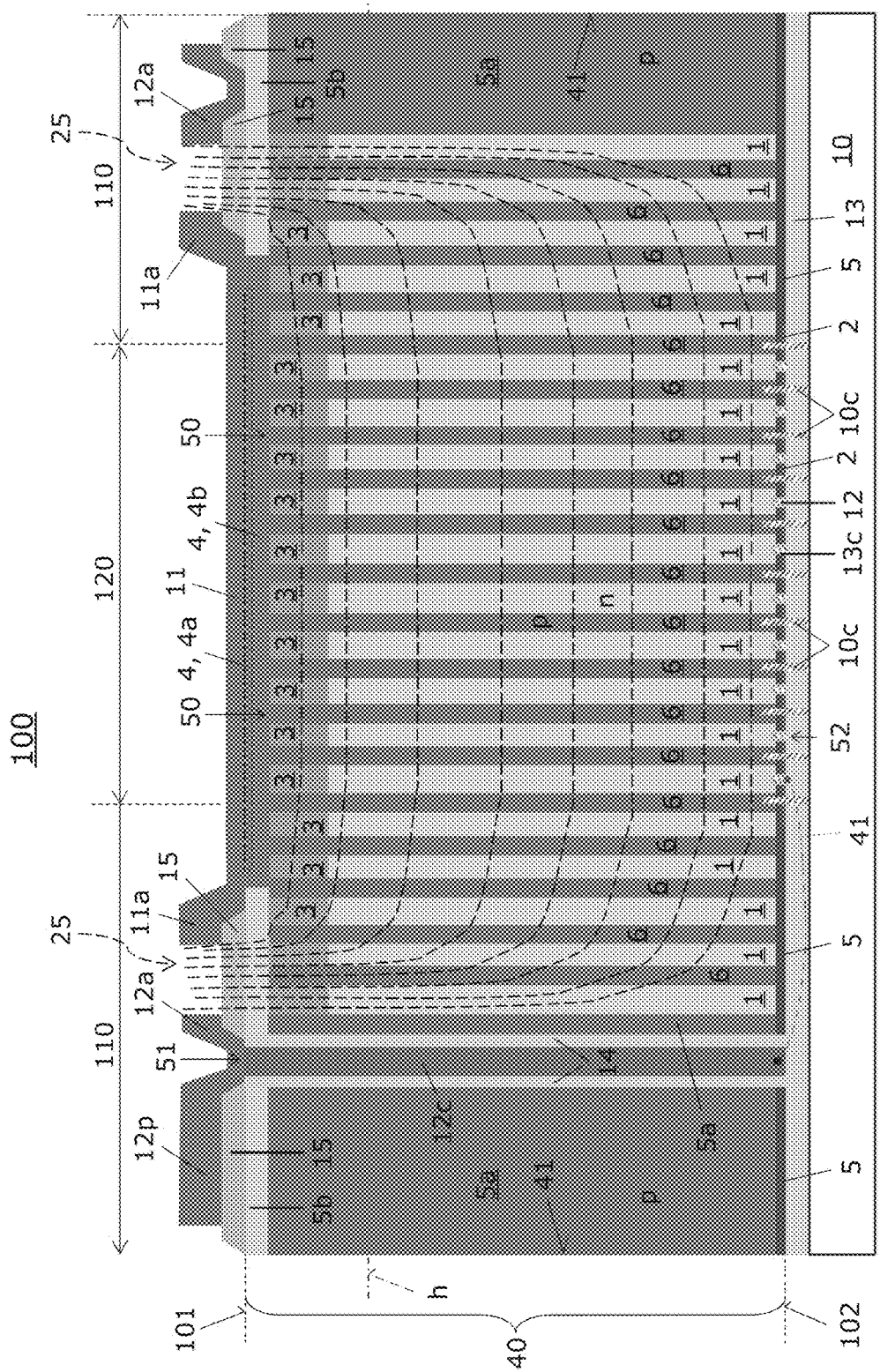
FIG. 1 illustrates a vertical cross-section through a semiconductor body of a field-effect semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side of a semiconductor substrate or body, typically a respective substantially flat surface. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to field-effect semiconductor devices, in particular to field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a drain metallization arranged on the first surface and a source metallization and an insulated gate electrode arranged on a second surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or about 500 V. Within this specification the terms "power semiconductor device" and "power semiconductor component" are used synonymously.

The term "edge-termination structure" as used in this specification intends to describe a structure that is configured to provide in a blocking mode a transition region in which a high electric voltage, i.e. a voltage of high absolute value compared to ground, such as a drain voltage around an active area of the semiconductor device change gradually to the potential at or close to the edge of the device and/or to a reference potential such as ground, source- or gate potential. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are typically in low Ohmic connection with a drain electrode (drain metallization). The source region is typically in low Ohmic connection with a source electrode (source metallization).

In the context of the present specification, the term "in Ohmic connection" intends to describe that there is an ohmic current path, e.g. a low-ohmic current path, between respective elements or portions of a semiconductor device when no voltages or only small probe voltages are applied to and/or across the semiconductor device. Within this specification the terms "in Ohmic connection", "in resistive electric connection", "electrically coupled", and "in resistive electric connection" are used synonymously. In the context of the present specification, the term "in Ohmic contact" intends to describe that two elements or portions of a semiconductor device are in direct mechanical ((intimate physical)) contact and in Ohmic connection.

The terms "electrical connection" and "electrically connected" describes an Ohmic connection between two features.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e. g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone whereby the current flow between two electrodes or metallizations connected to the semiconductor body can be prevented.

In the context of the present specification, the term "mesa" or "mesa region" intends to describe a semiconductor region between two adjacent trenches extending into the semiconductor substrate or body in a vertical cross-section.

The term "pn-junction" as used in this specification intends to describe the boundary surface between adjoining semiconductor regions or semiconductor portions of different conductivity type.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1, a first embodiment of field-effect semiconductor device 100 is explained. FIG. 1 illustrates a vertical cross-section through a semiconductor body 40 of the semiconductor device 100. The semiconductor body 40 extends between a first side, typically a flat first surface 101, facing a vertical direction, and second side, typically a flat second surface (back surface) 102 arranged opposite to the first surface 101. In a horizontal direction that is substantially parallel to the first surface 101, the semiconductor body 40 is delimited by an edge or kerf 41, for example a sawing edge, which is substantially orthogonal to the first surface 101. In the following, the edge 41 is also referred to as lateral edge 41. The semiconductor body 40 has an active area 120 and a peripheral area 110 arranged between the active area 120 and the edge 41. Typically, the peripheral area 110 surrounds the active area 110 when seen from above.

The semiconductor body 40 includes a mono-crystalline drift region 1 of a semiconductor material, such as silicon, doped with first dopants (dopants of a first conductivity type) typically providing a first number of first free charge carriers per unit in the semiconductor material. In the exemplary embodiment, drift region 1 is n-type, i.e. doped with n-type dopants. For example, the semiconductor material may be silicon and the n-type dopants may be electrically active phosphorous or arsenic impurities providing one free electron per unit.

The semiconductor body 40 typically includes a bulk mono-crystalline substrate of the semiconductor material at the first surface 101 and at least one layer, typically at least one epitaxial layer of the same semiconductor material formed thereon and extending to the second surface 102. Using the epitaxial layer(s) provides more freedom in tailoring the background doping of the material since the doping concentration can be adjusted during deposition of the epitaxial layer or layers.

A p-type body layer 5 forming a pn-junction with the drift region 1 is arranged between the drift region 1 and the second side 102.

A source metallization 10 and in Ohmic connection with the drift region 1 is arranged on the second side 102. As illustrated in FIG. 1, the source metallization 10 may substantially or completely cover the second side 102.

A drain metallization 11 in Ohmic connection with the drift region 1 is arranged on the first side 102, i.e. opposite to the source metallization 10.

In the exemplary embodiment, the drain metallization 11 completely covers an active area 110 and partly extends into a peripheral area 110 typically surrounding the active area 120 when seen from above.

As illustrated in FIG. 1, the drift region 1 may include an upper sub-layer 3 of the same or a higher doping concentration. Further, a highly n-doped drain and/or a highly n-doped drain field-stop layer are typically arranged between said drift region and the drain metallisation 10.

Typically, the semiconductor device 100 includes an n-type drain- and field-stop layer 4 including a field-stop region 4b having a higher doping concentration than the drift region 1, and a drain region 4a having a higher doping concentration than the field-stop region 4b and arranged between the field-stop layer 4b and the drain metallization 11.

At least the drain region 4b may extend to the first side 101 and is typically in Ohmic contact with drain metallisation 10.

In the active area 120, a plurality of gate electrodes 12 is arranged next to the second side 102 and electrically insulated from the semiconductor body 40 by respective gate dielectric regions 13c. Accordingly, respective operable switchable channel regions may be formed in the body layer 5 for providing low Ohmic connections between the source metallization 10 and the drift region 1, and thus between the source metallization 10 and the drain metallization 11 in the illustrated exemplary embodiment of an n-channel MOSFET, in a forward mode of the field-effect semiconductor device 100.

In embodiments referring to p-channel MOSFET, the doping relations are reversed.

As illustrated in FIG. 1, the body layer 5 may, in the active area 120, be spaced apart from the second side 102 by a typically highly n-doped source layer 2 forming a further pn-junction with the body layer 5, in Ohmic connection with the source metallization 10 and typically arranged at the second side 102.

The gate electrodes 12 and the switchable channel regions may define the active area 120. The active area 120 may also be defined by the presence of source regions and/or by the presence of active cells, e.g. MOSFET-cells, for carrying a load current between the source metallization 10 and the drain metallization 11.

In the exemplary embodiment, the gate electrodes 12 are implemented as trench gate electrodes, i.e. as electrodes that are arranged in respective trenches extending from the second side 102 through the body layer 5 into the drift region 1.

Accordingly, the source layer 2 and the body layer 5 are, in the shown vertical cross-section, separated by the trench gate electrodes 12 into respective portions forming source regions and the body regions, respectively.

In other embodiments, the gate electrodes are arranged on the second side 102.

The body layer 5 is typically arranged at the second side 102, at least in the peripheral area 110.

In the exemplary embodiment, the proportions of the source layer 2 and the body layer 5 are in Ohmic connection with the source metallisation 10 via source contacts 10c that may be implemented as shallow trench contacts formed through a dielectric layer 13 arranged at the second side 102, and between the second side 102 and the source metallisation 10. In the following, the dielectric layer 13 is also referred to as second dielectric layer. The source contacts 10c may e.g. be formed by doped poly-silicon regions. In other embodiments, the source metallization 10 electrically contacts the source regions and the body regions substantially at the first side 101.

Further, higher p-doped body contact regions (not shown) may be arranged between the source contacts 10c and the body regions and between the source metallization 10 and the body regions, respectively.

The gate electrodes 12 are connected to a gate metallization 12a, 12p typically forming a gate pad 12p that is arranged in the peripheral area 110 at the first side 101, via a first through contact structure 12c, 14 extending in the peripheral area 110 between the first side 101 and the second side 102. Accordingly, the semiconductor device 100 may be operated as a three-terminal device (source-down MOSFET).

The first through contact structure 12c, 14 may be formed by conductive region 12c such as poly-Si in Ohmic connection with the gate electrode 12 via a wiring 41 next to the second side 102, and a dielectric layer 14 electrically insulating the conductive region 12c from the semiconductor body 40. For sake of clarity, the wiring 41, which may be implemented as conducting paths of e.g. poly-Si, is only schematically indicated in FIG. 1.

In the exemplary embodiment, the first through contact structure 12c, 14 is formed in a vertical trench 51 extending from the first side 101 to the second side 102 and through a p-type field-stop region 5a in Ohmic connection with the body layer 5.

When seen from above and in normal projections onto horizontal planes h which are at least substantially parallel to the first side 101, respectively, the p-type field-stop region 5a typically at least substantially surrounds the drift region 1 and the gate electrodes 12.

Accordingly, the electric field lines 25 in a blocking mode of the semiconductor device 100, in which the pn-junction between the drift region 1 and the body layer 5 is reversely biased, can be bent reliably away from the edge 41 at least towards the first side 101.

This ensures a particular high breakdown voltage. The electric field lines 25 may even cross the first side 101 substantially perpendicular as illustrated in FIG. 1. Further, manufacturing of the semiconductor device 100 is facilitated. For example, structuring of the first side 101 (backside of the wafer) may be achieved with a low thermal budget. This is explained in more detail below with regard to FIG. 7A to FIG. 21.

Different to the p-type field-stop region 5a, the first through contact structure 12c, 14 does typically not surround the drift region 1 and the gate electrodes 12 when seen from above.

Further, when seen from above, the area of the first through contact structure 12c, 14 is typically at least one order of magnitude lower than the area the p-type field-stop region 5a.

The p-type field-stop region 5a may be at least substantially (e.g. neglecting the trench for the first through contact structure 12c, 14 shaped as a hollow cylinder), typically as a right hollow cylinder. The term hollow cylinder as used herein is to be understood as a body with an inner and an outer surface shell each of which is a ruled surface spanned by a family of parallel lines. The term circular hollow cylinder shall include circular hollow cylinder, elliptic hollow cylinder but also hollow prism.

The vertical extension of the field-stop region 5a is typically at least about 70%, at least about 75% or even least about 80% of a distance between the first side 101 and the second side 102.

The body layer 5 may have a higher doping concentration than the field-stop region 5a. However, it is rather the integrated dopant concentration than the volume specific doping concentration that determines the function of the p-type field-stop region 5a. Accordingly, the volume specific doping concentration of the field-stop region 5a is typically higher for p-type field-stop region 5a of lower (horizontal) wall thickness.

As illustrated in FIG. 1, a p-type JTE-region (junction extension termination region) 5b having a different doping concentration than the field-stop region 5a may be arranged in the peripheral area 110, and between the p-type field-stop region 5a and the first side 101.

The p-type JTE-region 5b is typically also substantially shaped as a hollow cylinder and may surround the drift region 1 and the drain- and field-stop layer 4 when seen from above.

Further, the p-type JTE-region 5b may extend to the drain- and field-stop layer 4.

In the exemplary embodiment, the p-type semiconductor structure 5, 5a, 5b formed by the field-stop region 5a, the adjoining body layer 5 and the p-type JTE-region 5b act as an embedding p-well at source potential for the drift region 1 during device operation.

The p-type semiconductor structure 5, 5a, 5b typically extends from the first side 101 to the second side 102. The p-type semiconductor structure 5, 5a, 5b may however only substantially extend from the first side 101 to the second side 102, i.e. the vertical extension of the p-type semiconductor structure 5, 5a, 5b corresponds to at least about 80%, more typically at least about 90%, even more typically at least about 95% or even 97% of the distance between the first side 101 and the second side 102.

Alternatively, the JTE-region 5b may be slightly n-doped or a substantially intrinsic semiconductor region. In these embodiments, the p-type semiconductor structure is formed by the field stop region 5a and/or outer portions of the body layer arranged in the peripheral area 110.

As further illustrated in FIG. 1, the gate metallization 12a, 12p is arranged on a dielectric layer 15 arranged on the first side 101 protecting the semiconductor body 40 at the first side 101 and insulating the gate metallization 12a, 12p from the semiconductor body 40. In the following the dielectric layer 15 is also referred to as first dielectric layer. Further, the dielectric layer 15 may act as field oxide or field dielectric for field plate portions 11a, 12a of the drain metallization 11 and the gate metallization, respectively. The field plate portions 11a, 12a form additional equipotential region (edge termination) structures in the peripheral area 110 to facilitate guiding the electric field lines 25 through the first side 101.

Typically, the field plate portions 11a, 12a surround the active area 120 when seen from above.

The drain field plate 11a and/or the gate field plate 12a may be stepped, i.e., the vertical (minimum) distance of the field plates 11a and/or 12a from the first side 101 may change substantially stepwise in horizontal direction. In other embodiments, only one or even none of the field plate 11a, 12a is arranged on the first side 101.

In the exemplary embodiment, the dielectric layer 15 has two openings, namely a central first opening filled with a central portion of the drain metallisation 11 and second opening formed in the peripheral area 110 for contacting the gate pad 12p and the conductive region 12c of the first through contact structure 12c, 14.

One or both of the dielectric layers 13, 15 may substantially extend to the edge 41.

In the illustrated vertical cross-section of FIG. 1, compensation regions 6 alternate with portions 1 of the drift region 1 both in the active area 120 and in the peripheral area 110. The compensation regions 6 are typically made of the same semiconductor material as the drift region 1 but are doped with second dopants (dopants of a second conductivity type opposite to the first conductivity type) providing a second number of free second charge carriers per unit in the semiconductor material.

In the exemplary embodiment, compensation regions 6 are p-type, i.e. doped with p-type dopants. For example, the semiconductor material may be silicon and the p-type dopants may be electrically active boron impurities providing one free hole per unit in silicon.

Typically, a plurality, e.g. more than ten, of alternating n-type drift portions 1 and p-type compensation regions 6 forming respective pn-junctions with each other are arranged in the active area 120.

In the vertical cross-section, the p-type compensation regions 6 may be formed as vertically orientated pillars, substantially vertically orientated strip-type parallelepipeds, rectangles or ellipsoids.

In the following, the n-type drift portions 1 are also referred to as n-type pillar regions 1 and first pillar regions 1 (of the first conductivity type), respectively, and the p-type compensation regions 6 are also referred to as p-type pillar regions 6 and second pillar regions 6' (of the second conductivity type), respectively.

The p-type compensation regions 6 may be formed in trenches 50 extending from the first side 101 into the semiconductor body 40 by selective epitaxial deposition.

In the exemplary embodiment, the compensation regions 6 have in the active area 120 and the peripheral area 110 the same horizontal pitch.

The term "pitch" as used within this specification intends to describe a distance between repeated elements in a structure possessing translational symmetry and typically corresponds to length of a primitive axis (vector) of the structure and length of a base vector of a regular lattice, respectively.

Furthermore, the compensation regions 6 in the active area 110 and the compensation regions 6 in the peripheral area 120 may have the same vertical extension.

At least the compensation regions 6 of the active area 120 are in Ohmic connection with the source metallization 10, typically via the higher p-doped body layer 5 arranged between the compensation regions 6 and the second side 102 and/or via the source contacts 10c.

According to an embodiment, the doping concentrations of the compensation regions 6 and the drift portions 1 are chosen such that, in the off-state, their charges can be mutually depleted and that, in the on-state, an uninterrupted, low-resistive conduction path is formed from the source metallization 10 to the drain metallization 11.

A total number of free electrons provided by n-type dopants typically substantially matches a total number of free holes provided by p-type dopants at least in the active area 120. Typically, the total number of free electrons provided by the n-type dopants varies by less than 5%, more typically less than 1% from the total number of free holes provided by the p-type dopants. Accordingly, the drift portions 1 and the first compensation regions 6 form a pn-compensation structure 1, 6.

Figure 2:
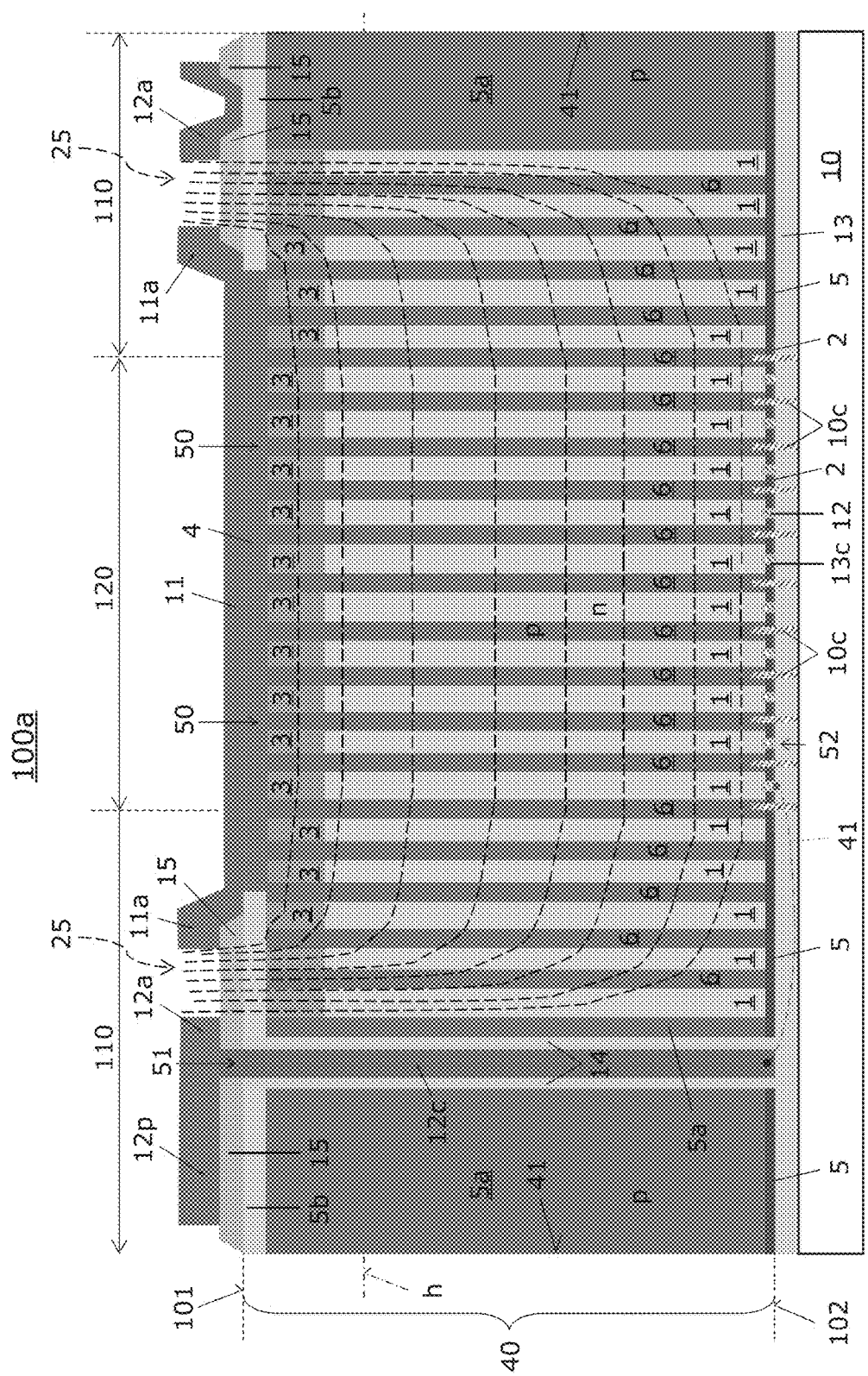
FIG. 2 illustrates a vertical cross-section through a semiconductor body of a field-effect semiconductor device according to an embodiment.

FIG. 2 illustrates a vertical cross-section through a semiconductor body 40 of a field-effect semiconductor device 100*a*. The field-effect semiconductor device 100' is similar to the semiconductor device 100 explained above with regard to FIG. 1, and is also implemented as charge-compensation MOSFET.

However, the conductive region 12*c* of the first through contact structure 12*c*, 14 extends through the dielectric layer 15. Accordingly, opening the dielectric layer 15 from the first side 101 may be avoided during manufacturing. This is explained in more detail below. Note that opening the dielectric layer 15 from the first side 101 requires a comparatively high accuracy. Otherwise, an undesired Ohmic connection may be formed between the gate pad 12*p* and the semiconductor body 40.

Figure 3:
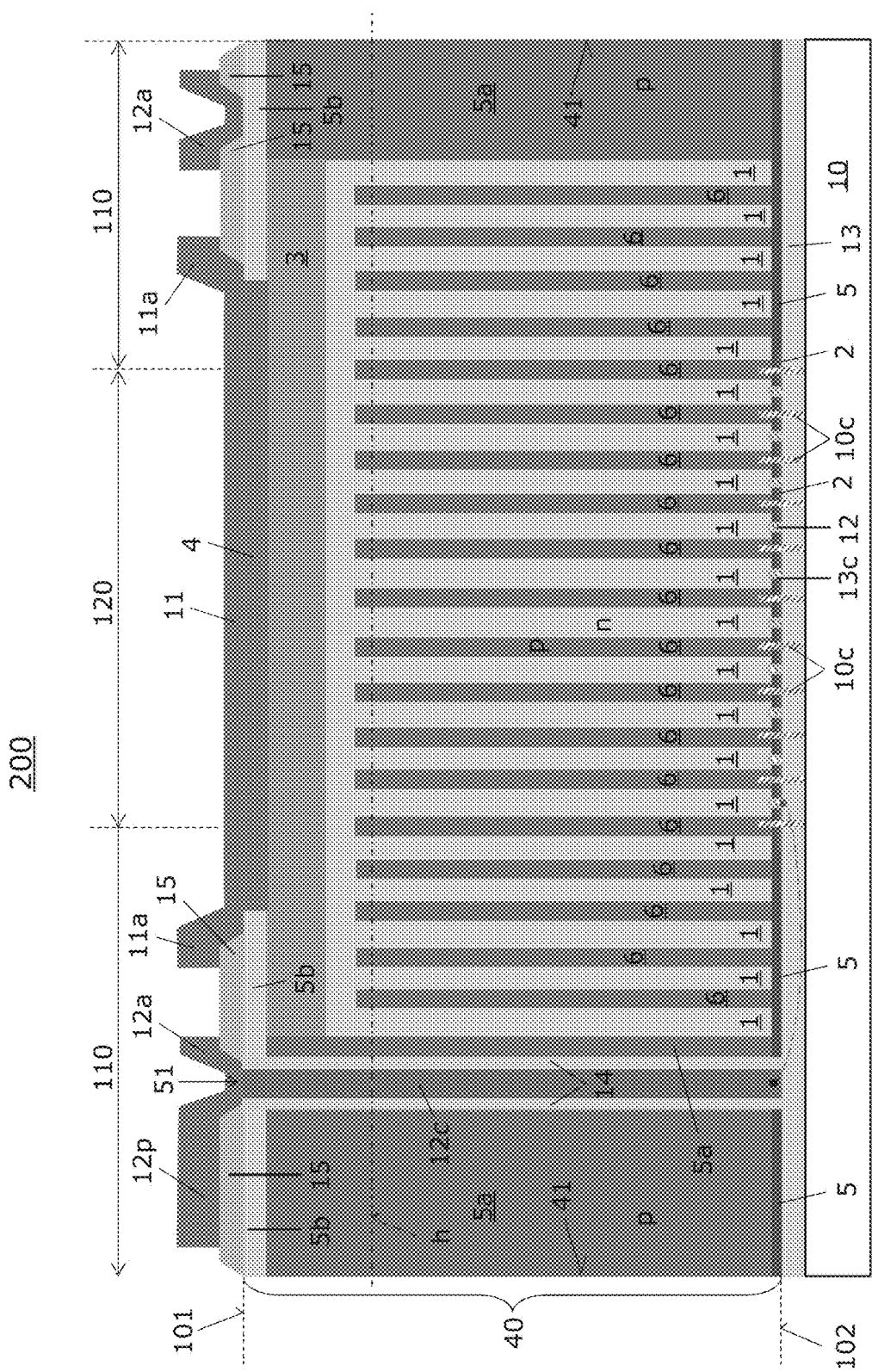
FIG. 3 illustrates a vertical cross-section through a semiconductor body of a field-effect semiconductor device according to an embodiment.

FIG. 3 illustrates a vertical cross-section through a semiconductor body 40 of a field-effect semiconductor device 200. The field-effect semiconductor device 200 is similar to the semiconductor device 100 explained above with regard to FIG. 1.

However, the compensation regions 6 of the field-effect semiconductor device 200 are spaced apart from the drain- and field-stop layer 4 by a current-spread portion of the drift region 1, 3.

The contact between the conductive region 12*c* of the first through contact structure 12*c*, 14 and the gate pad 12*p* of the semiconductor device 200 may also be implemented as explained above with regard to FIG. 2.

Figure 4:
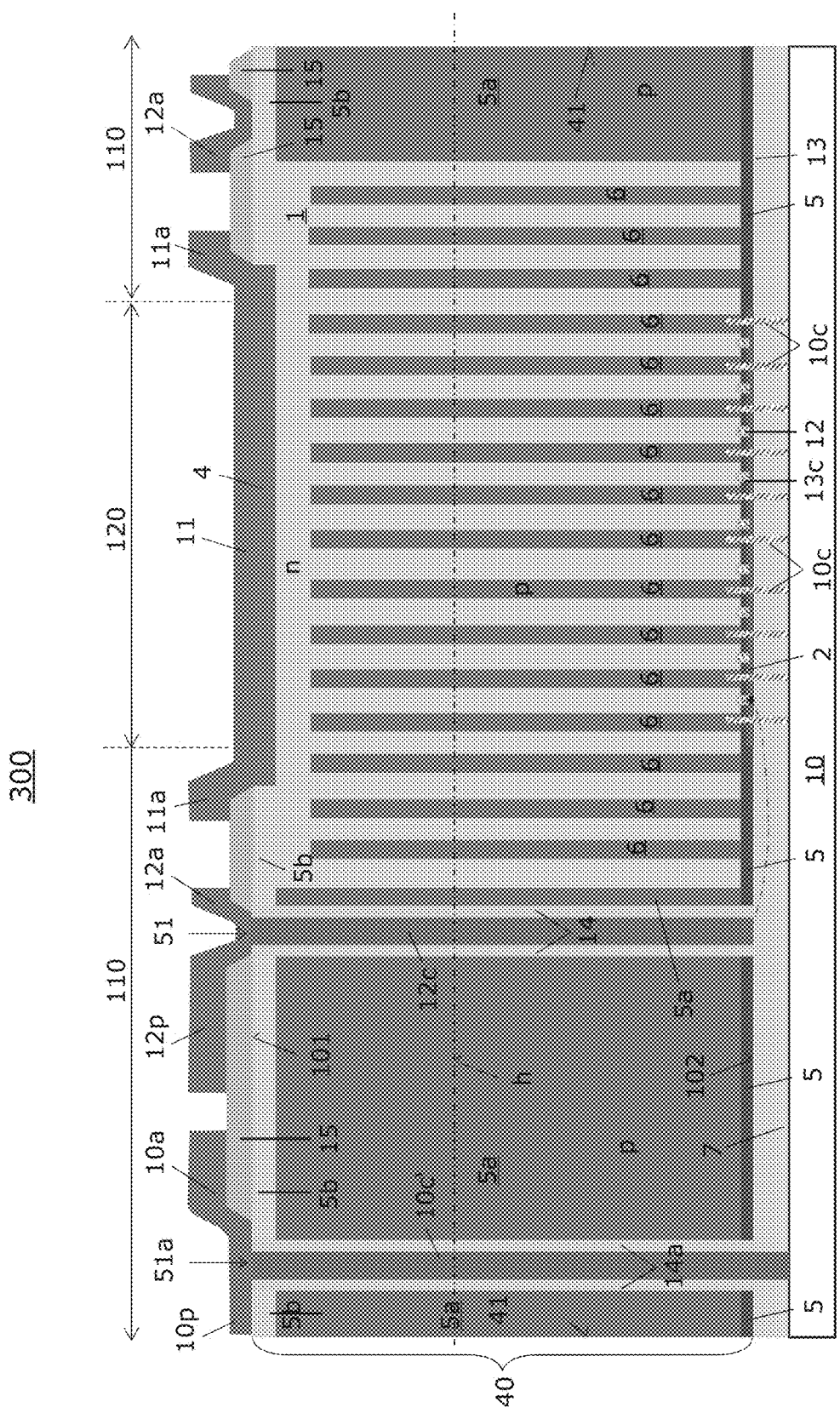
FIG. 4 illustrates a vertical cross-section through a semiconductor body of a field-effect semiconductor device according to an embodiment.

FIG. 4 illustrates a vertical cross-section through a semiconductor body 40 of a field-effect semiconductor device 300. The field-effect semiconductor device 300 is similar to the semiconductor device 200 explained above with regard to FIG. 2.

However, the semiconductor device 300 is a silicon-on-insulator (SOI)—device manufactured using an SOI-wafer with a buried oxide layer forming the second dielectric layer 13 in the manufactured device 300.

Accordingly, a further semiconductor layer 7 may be arranged between the source metallization 10 and the second dielectric layer 13. In this embodiment, the source contacts 10*c* typically extend to the source metallization 10.

The contact between the conductive region 12*c* of the first through contact structure 12*c*, 14 and the gate pad 12*p* of the semiconductor device 300 may also be implemented as explained above with regard to FIG. 2.

Further, a second through contact structure 10*c'*, 14*a* extends in the peripheral area 110 of the semiconductor device 300 from the first side 101 to the source metallization 10 and through the field-stop region 5*a*. The second through contact structure 10*c'*, 14*a* is formed in a second deep trench 51*a* and includes a dielectric layer 14*a* arranged at the sidewall of the trench 51*a* and a conductive region 10*c'* providing an Ohmic connection between the source metallization 10 on the second side 102 and a source pad 10*p* on the first side 101. Similar as explained for the first through contact structure 12*c*, 14, the dielectric layer 14*a* separates the conductive region 10*c'* from the semiconductor body 40.

As illustrated in FIG. 4, a source field plate 10*a* in Ohmic connection with the source metallization 10 may additionally be arranged on the first side 101, and arranged between the source pad 10*p* and the drain metallization 11.

The source field plate 10*a* and the source pad 10*p* are typically formed by a contiguous region.

Figure 5:
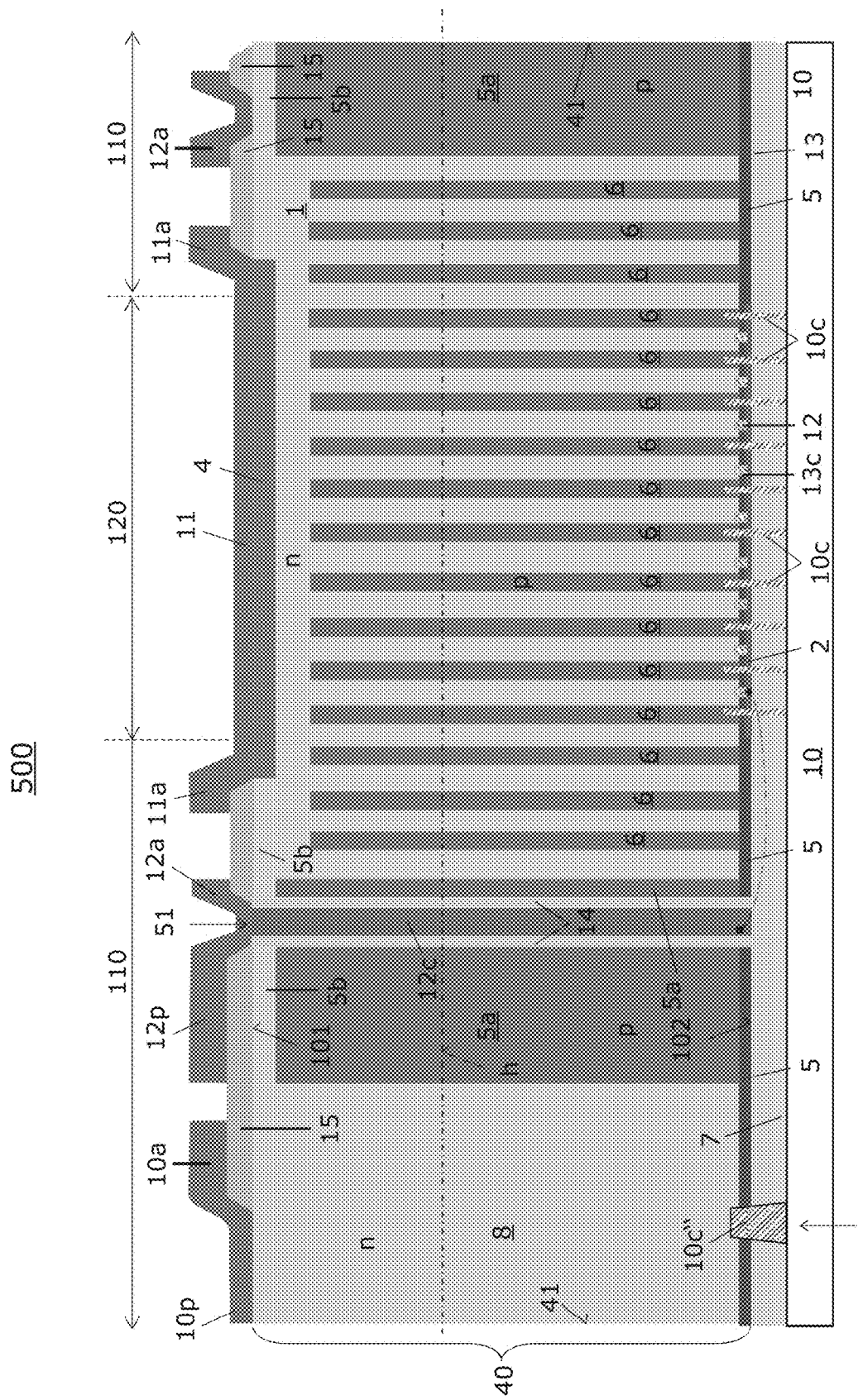
FIG. 5 illustrates a vertical cross-section through a semiconductor body of a field-effect semiconductor device according to an embodiment.

FIG. 5 illustrates a vertical cross-section through a semiconductor body 40 of a field-effect semiconductor device 500. The field-effect semiconductor device 500 is similar to the semiconductor device 300 explained above with regard to FIG. 4.

However, the source field plate 10*a* and the source pad 10*p* of the peripheral area 110 of the semiconductor device 500 are in Ohmic connection with the source metallization 10 via an n-type contact region 8 arranged between the left lateral edge 41 and the p-type field-stop region 5*a* and a further source contact 10*c''* extending from the source metallization 10 at least to the contact region 8.

The contact between the conductive region 12*c* of the first through contact structure 12*c*, 14 and the gate pad 12*p* of the semiconductor device 500 may also be implemented as explained above with regard to FIG. 2.

Figure 6:
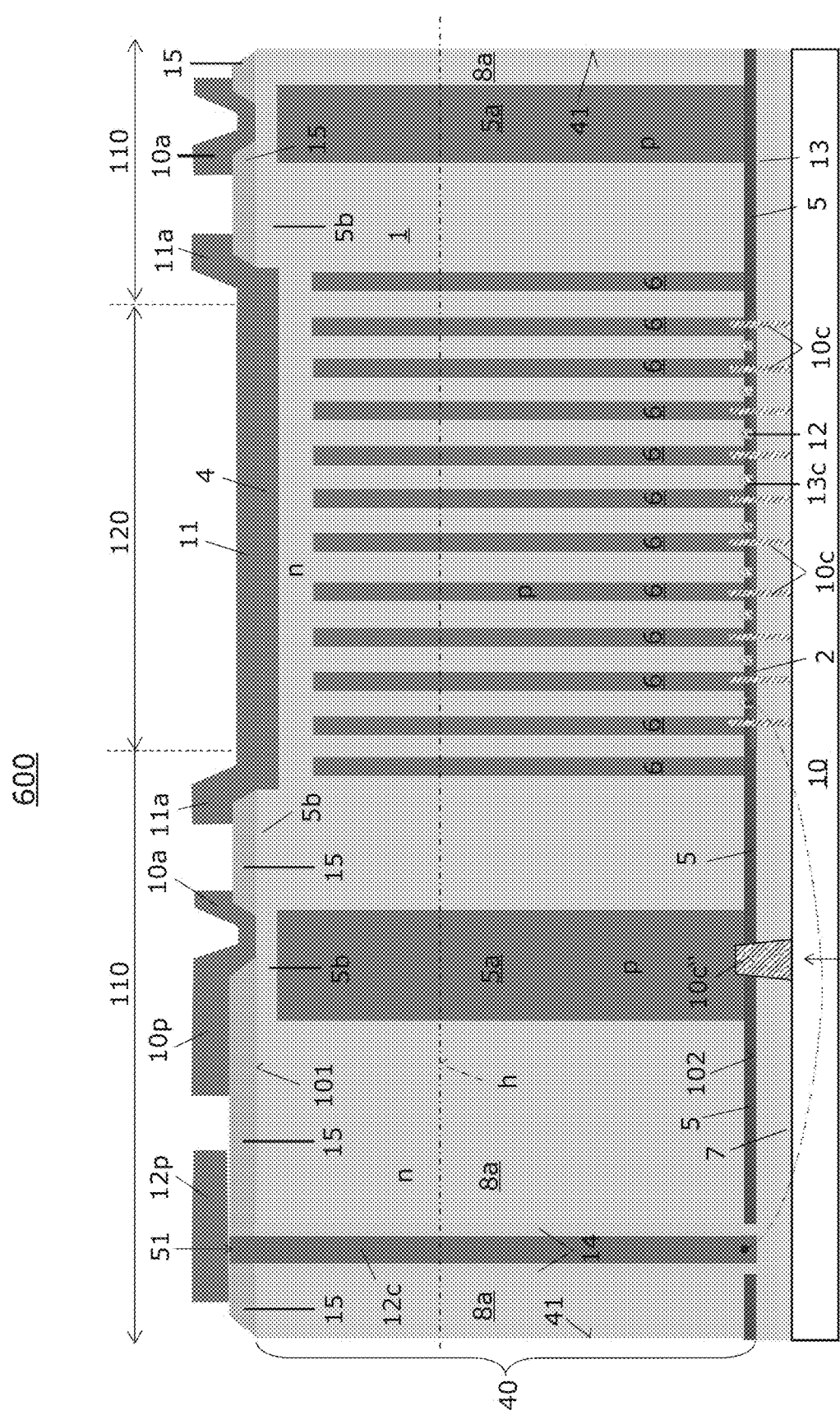
FIG. 6 illustrates a vertical cross-section through a semiconductor body of a field-effect semiconductor device according to an embodiment.

FIG. 6 illustrates a vertical cross-section through a semiconductor body 40 of a field-effect semiconductor device 600. The field-effect semiconductor device 600 is similar to the semiconductor device 500 explained above with regard to FIG. 5.

However, there is no gate field plate formed on the first side 101. Instead, the source field plate 10*a* surrounds the active area 120 of semiconductor device 600 when seen from above. Note that the voltage difference between gate- and source potential is with respect to blocking voltage of minor importance for high voltage semiconductor device.

Further, the source field plate 10*a* and the source pad 10*p* are connected with the source metallization 10 via the field-stop region 5*a*, the JTE-region 5*b* and the further source contact 10*c''*.

Further, the first through contact structure 12*c*, 14 is formed in trench 51 which extends through a typically low doped n-type edge region 8*a* arranged in the vertical cross-section between the lateral edge 41 and the p-type field-stop region 5*a*.

Even further, there may be only a few, only one or even no compensation regions 6 formed in the peripheral area 110 of the semiconductor device 600.

The field-effect semiconductor devices 100 to 600 may also be described as source-down semiconductor devices, in particular as source-down charge-compensation semiconductor devices (source-down super-junction semiconductor devices), having a drift region 1 of a first conductivity type, an embedding semiconductor structure 5, 5*a*, 5*b* of a second conductivity type for the drift region, and a first through contact structure 12*c*, 14. The embedding semiconductor structure 5, 5*a*, 5*b* extends at least substantially extending from a first side 101 to a second side 102 of a semiconductor body 40 in which the drift region 1 and the embedding semiconductor structure 5, 5*a*, 5*b* are formed. The first through contact structure 12*c*, 14 extends between the first side 101 and the second side 102, and includes a conductive region 12*c* in Ohmic connection with gate electrodes 12 overlapping, in a normal projection onto horizontal planes h parallel to at least one of the first side 101 and the second side 102, with the drift region 1 and arranged next to the second side 102, and a dielectric layer 14 electrically insulating the conductive region 12*c* from the semiconductor body 40. At least a portion of the semiconductor structure 5, 5*a*, 5*b* is, in the normal projection, arranged between the first through contact structure 12*c*, 14 and the gate electrodes 12.

In the following, manufacturing methods for those devices are explained.

Charge-compensation semiconductor devices may be produced with a so-called 'multiple epitaxy' process. In this case, an n-doped epitaxial layer, which may be several μm thick, is first grown on a highly n-doped substrate and commonly referred to as 'buffer epi'. In addition to a doping level introduced in the epitaxial step doping ions are introduced into the buffer epi through a mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as much time as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type charge-compensation regions (compensation regions) and n-type charge-compensation regions (drift portions). The manufacturing of the actual devices can then be conducted at this point.

Another technique for fabricating charge-compensation semiconductor devices involves trench etching and compensation with trench filling. The volume which absorbs the voltage is deposited in a single epitaxial step (n-doped epi) on a highly n-doped substrate, so that the thickness corresponds to the total thickness of the multilayered epitaxial structure. After that, deep trenches are etched, which determine the form of the p-columns (compensation regions). The deep trenches are then filled with p-doped epi which is at least substantially free of crystal defects.

Both techniques may be used to manufacture the charge-compensation semiconductor devices as explained above with regard to FIGS. 1 to 6.

With regard to FIG. 7A to FIG. 21 exemplary method steps of methods for manufacturing a charge-compensation semiconductor devices 700, 700a are explained in respective vertical cross-sections with respect to the 'multiple epitaxy' process.

In a first step, a wafer 30 may be provided. As illustrated in FIG. 7A, the wafer may be a SOI-wafer with an upper semiconductor layer 1a forming an interface 101 with a buried oxide layer 15 sandwiched between the upper semiconductor layer 1a and a lower semiconductor layer 7.

The upper semiconductor layer 1a and/or the lower semiconductor layer 7 may be respective silicon layers.

The buried oxide layer 15 may be a thermal oxide layer, e.g. having a vertical thickness of about 1 μm to about 5 μm.

The upper semiconductor layer 1a may have a vertical thickness of less than a few micrometers.

In the exemplary embodiment, the upper semiconductor layer 1 a and the lower semiconductor layer 7 are (slightly) n-doped. The doping relations illustrated in Figures may however also be reversed.

Thereafter, active device areas 121 which are surrounded by corresponding peripheral device areas 110 may be defined.

Thereafter, n-type dopants may be implanted into the upper semiconductor layer 1a to form a seed-layer 4' for a drain- and field-stop layer, and p-type dopants may be implanted into the upper semiconductor layer 1a in the peripheral area to form respective seed-layers 5', 5" for a JTE-region and a field-stop region. The resulting semiconductor structure 700 is illustrated in FIG. 7B.

Thereafter, a first epitaxial semiconductor layer 1e may be deposited on the upper layer 1a. The resulting semiconductor structure 700 is illustrated in FIG. 8A.

As illustrated in FIG. 8B, a subsequent thermal process may be used to activate and potentially drive in the implanted ions. Accordingly, the n-type drain- and field-stop layer 4, the p-type JTE-region 5' and a portion 5a' of the field-stop region may be formed.

Figure 9:
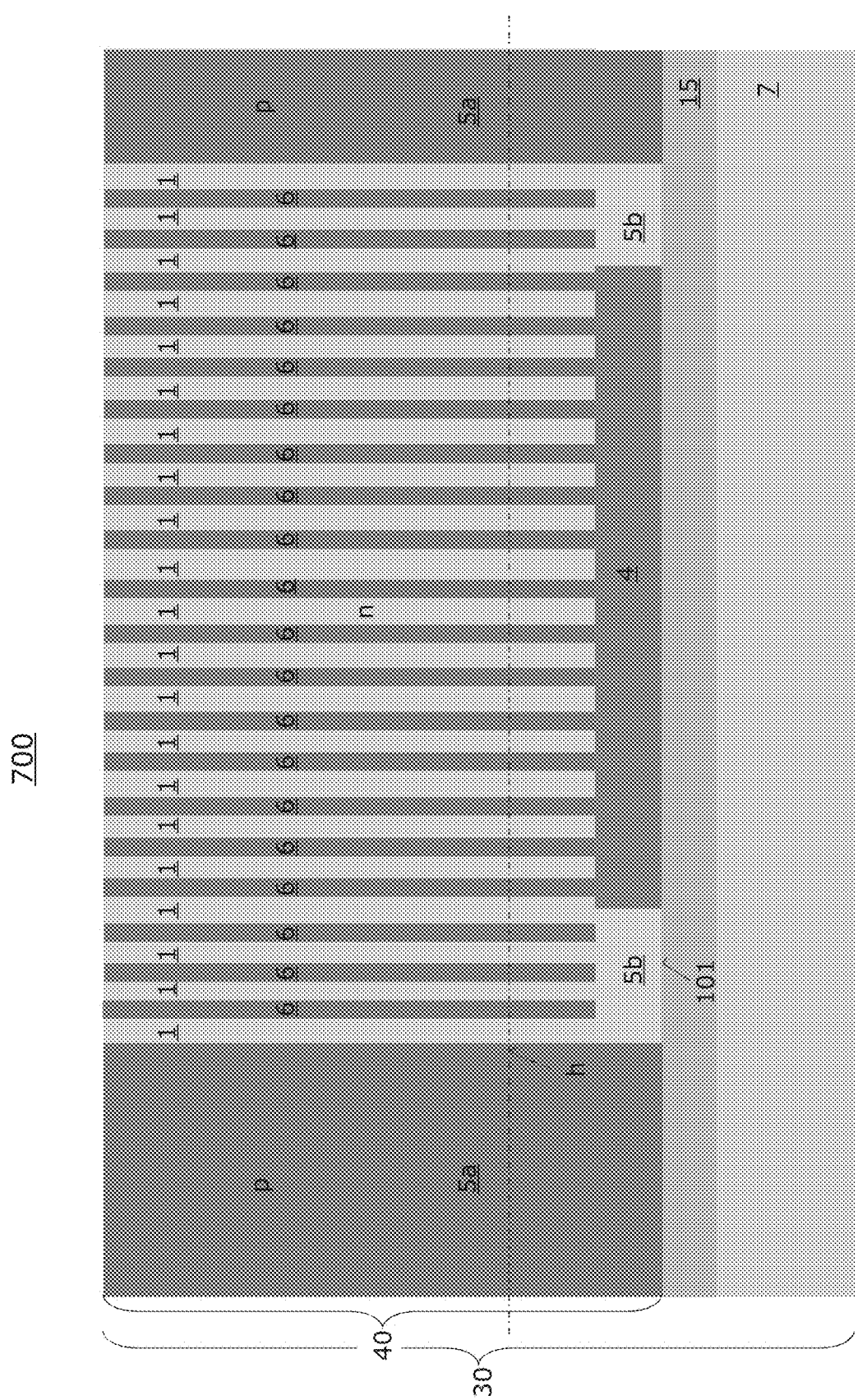

Thereafter, several sequences of epitaxial depositing the first semiconductor material (e.g. Si) and masked implantation and a further thermal process may be used to form the field-stop region 5 surrounding a charge-compensation structure having a plurality of compensation regions 6 which are spaced apart from each other and form respective pn-junctions with the drift region 1. The resulting semiconductor structure 700 is illustrated in FIG. 9.

Thereafter, an uppermost semiconductor layer 2, 5 extending to an upper side 102 of a semiconductor body 40 and a front-side 102 of the wafer 30, respectively, may be formed on the buried oxide layer 15 using epitaxial deposition.

Figure 10:
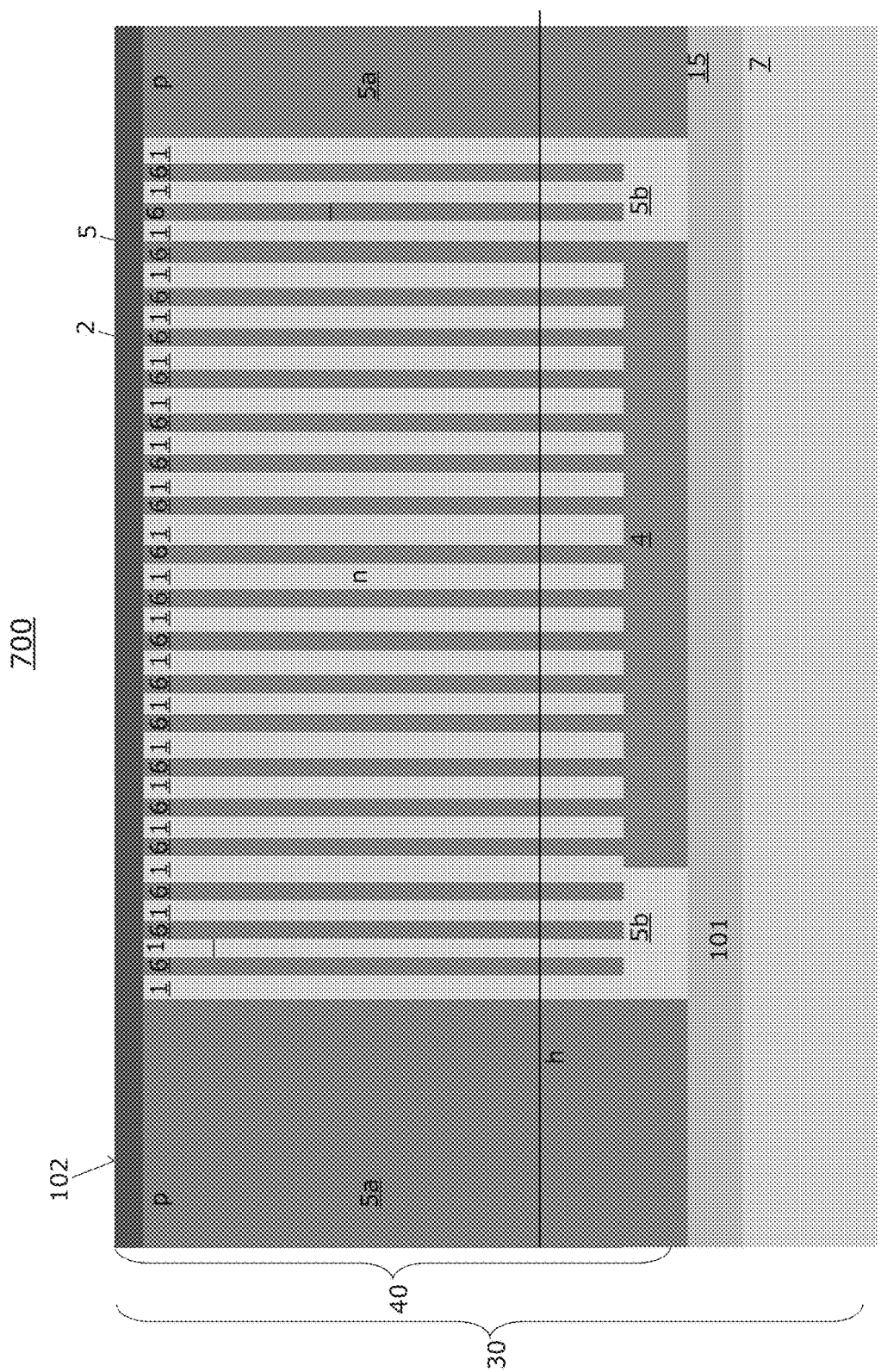

Thereafter, further implantation(s) and a further thermal process may be used to form a body layer 5 and a source layer 2 in the uppermost semiconductor layer 2, 5. The resulting semiconductor structure 700 is illustrated in FIG. 10.

The method steps explained so far may also be described as providing a wafer 30 with a semiconductor body 40 having a first side 101 and a second side 102 opposite the first side 101, and including a drift region 1 of a first conductivity type and a semiconductor structure 5, 5a of a second conductivity type extending from the first side 101 to the second side 102, and surrounding the drift region 1 in a normal projection onto a horizontal plane substantially parallel to the first side 101.

Thereafter, a first deep trench 51 may be etched in the peripheral area from the second side 102 to the dielectric layer 15. For this purpose a resist mask (not shown) may be formed at the second side 102. The dielectric layer 15 may be used as etch-stop.

Figure 11:
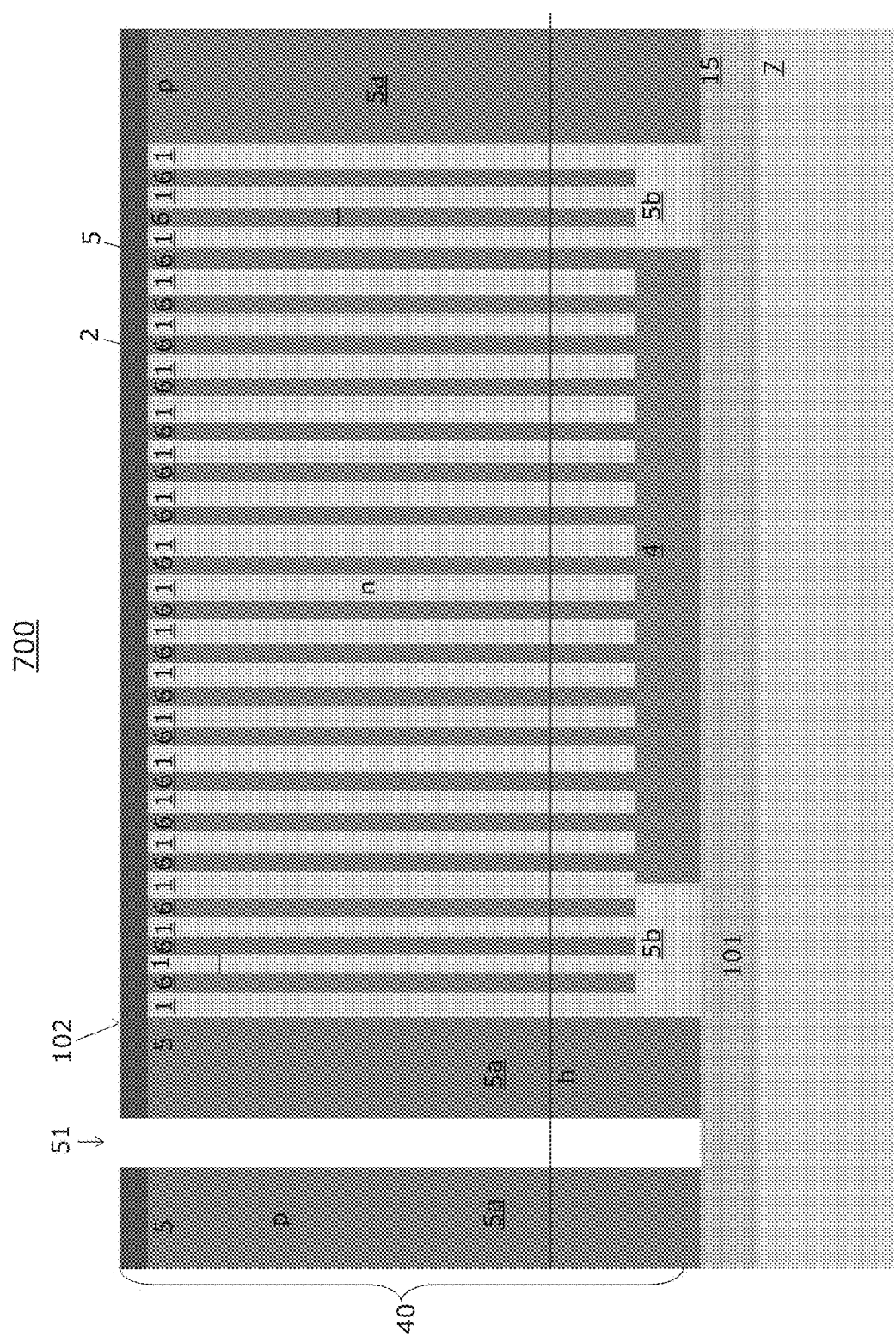

In the exemplary embodiment illustrated in FIG. 11, the first deep trench 51 is completely etched through the body layer 5 and the p-type field-stop region 5a.

The first deep trench 51 may e.g. have a circular shape when seen from above.

In the exemplary embodiment, the first deep trench 51 is surrounded by the body layer 5 and the p-type field-stop region 5a when seen from above.

Thereafter, a dielectric sidewall layer 14 may be formed at a sidewall of the first deep trench 51. This may e.g. be achieved by thermal oxidation.

Figure 12:
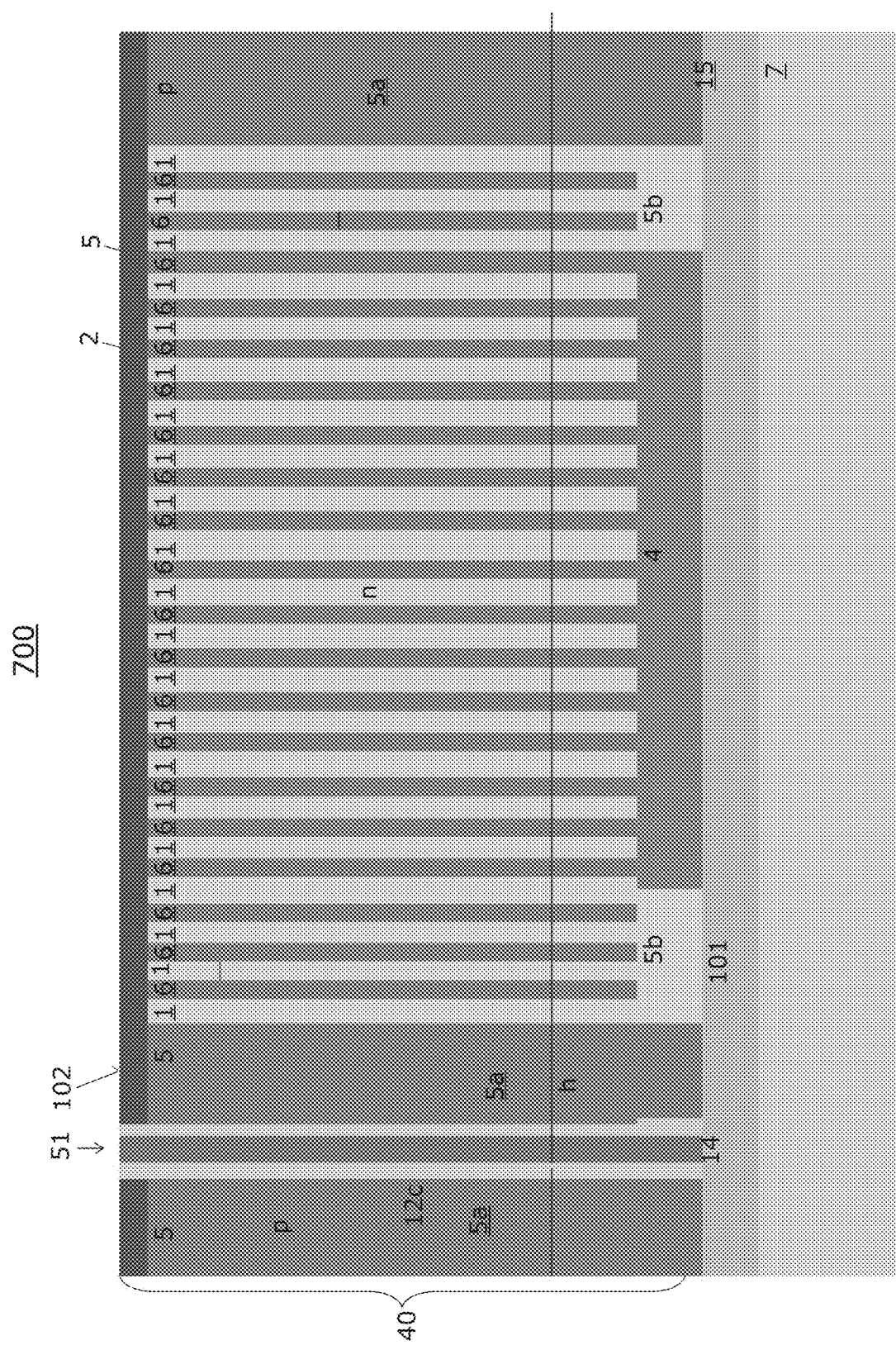

Thereafter, the first deep trench 51 may be filled with a conductive material such as doped poly-Si to form a conductive region 12c extending along the sidewall layer 14. This may be achieved by depositing and a subsequent polishing at the second side 102, e.g. a CMP-process (Chemical-Mechanical Polishing). The resulting semiconductor structure 700 is illustrated in FIG. 12.

Figure 13:
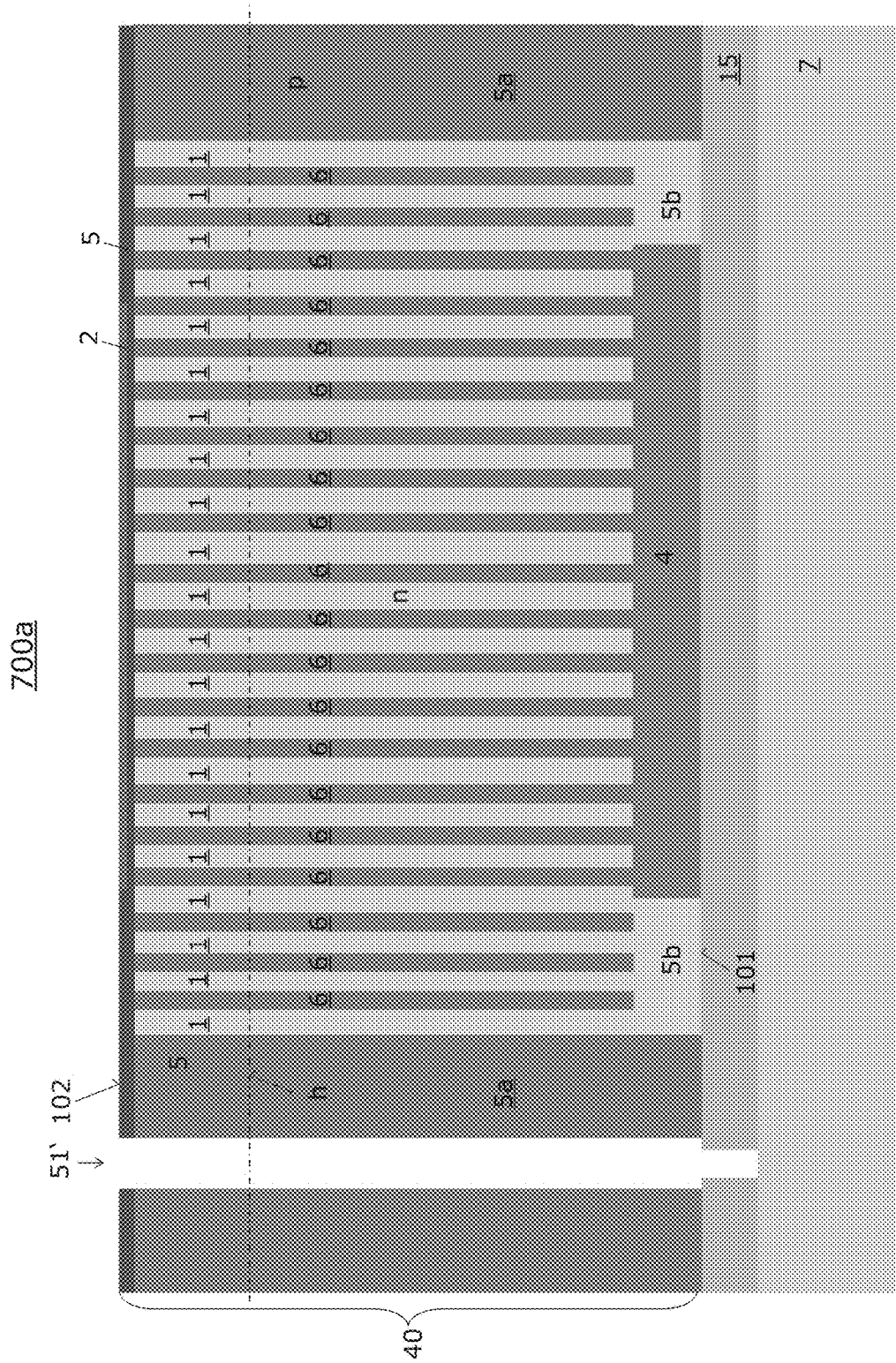
Figure 14:
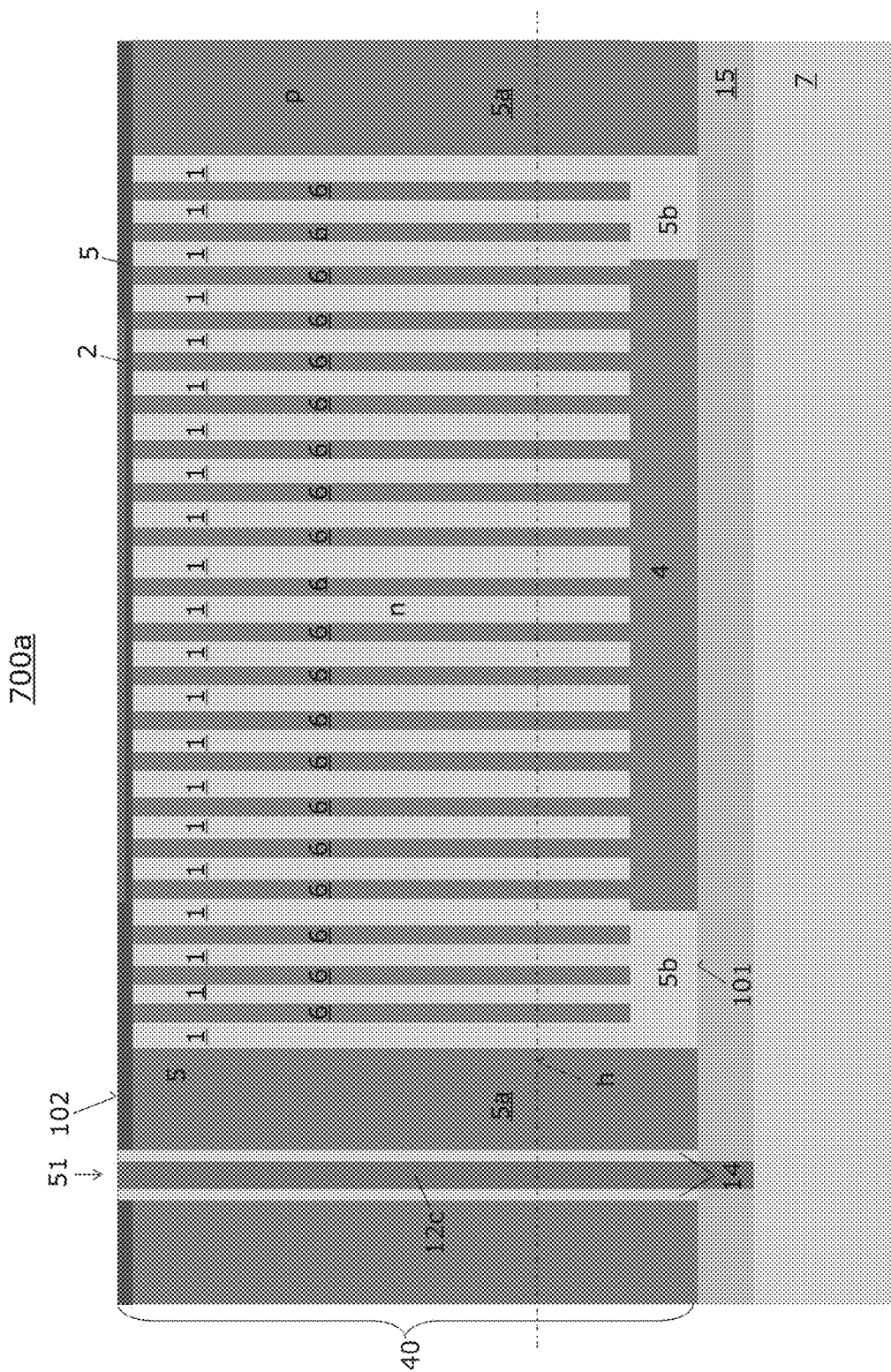

As illustrated in FIG. 13, a second etching process may be used for etching through the dielectric layer 15. Thereby, a deepened first deep trench 51' may be formed.

Thereafter, a conductive region 12c surrounded by a dielectric sidewall layer 14 may be formed in the deepened first deep trench 51'. This may be achieved similar as explained above with regard to FIG. 12. However, the conductive region 12c of the resulting semiconductor structure 700a illustrated in FIG. 14 extends through the dielectric layer 15. This facilitates later contacting (to a gate pad). Except for said later contacting, the subsequent processes for forming the devices 700, 700a are similar. For sake of clarity, these processes are mainly explained with regard to semiconductor structure 700.

After or prior to forming the first through contact structure 12c, 14, a plurality of insulated gate electrodes may be formed next to the second side 102 in the active device area(s).

Figure 15:
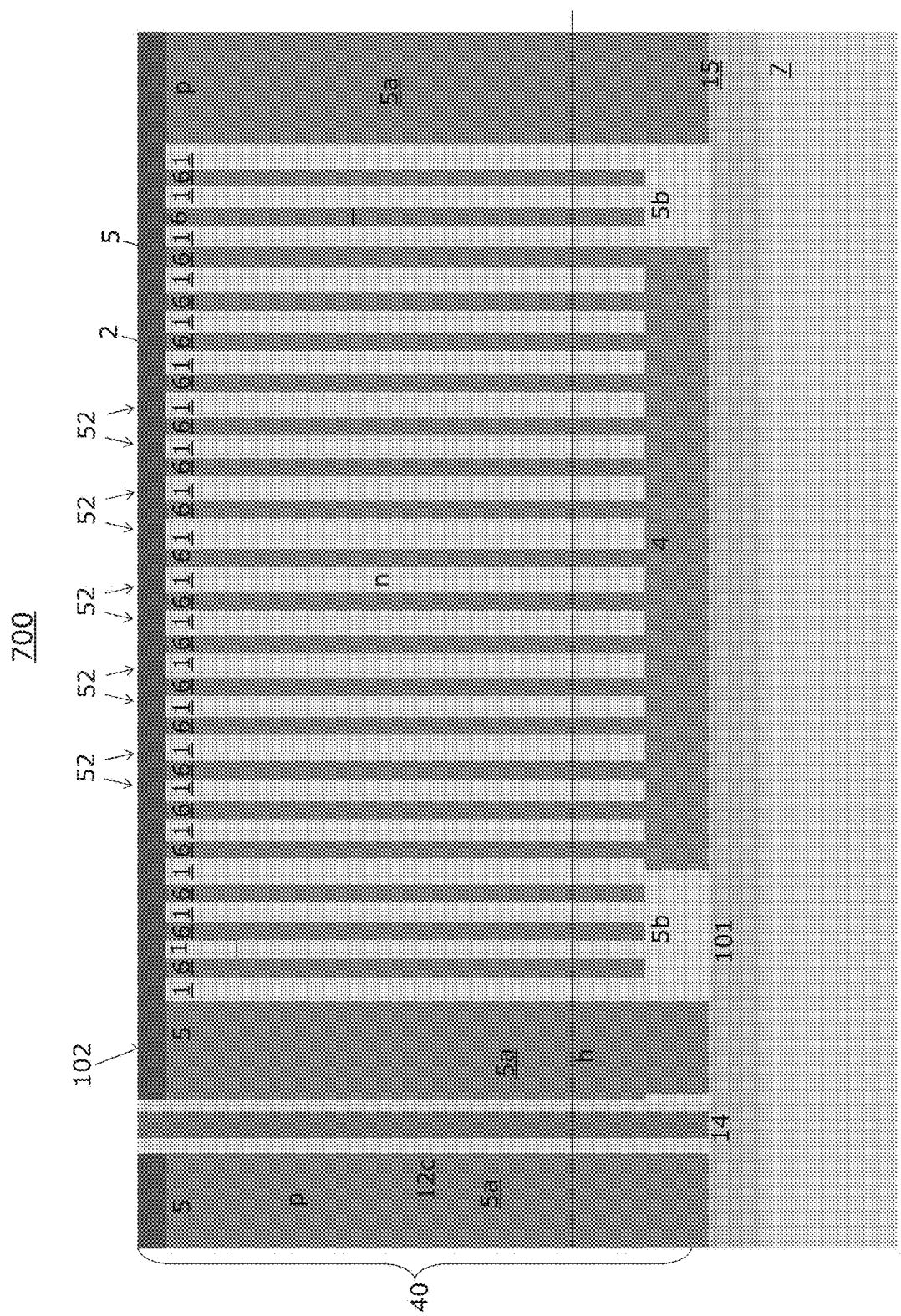

As illustrated in FIG. 15, this may include etching shallow trenches 52 from the second side 102 through the source layer 2 and the body layer 5 partially into the drift region 1.

Thereafter, gate dielectrics regions 13c may be formed at the side—and bottom walls of the shallow trenches 52.

Thereafter, the shallow trenches 52 may be filled with a conductive material such as doped poly-Si to form the gate electrodes 12.

Further, a wiring 41 may be formed between the conductive region 12c in the first deep trench 51 and the gate electrodes 12.

Figure 16:
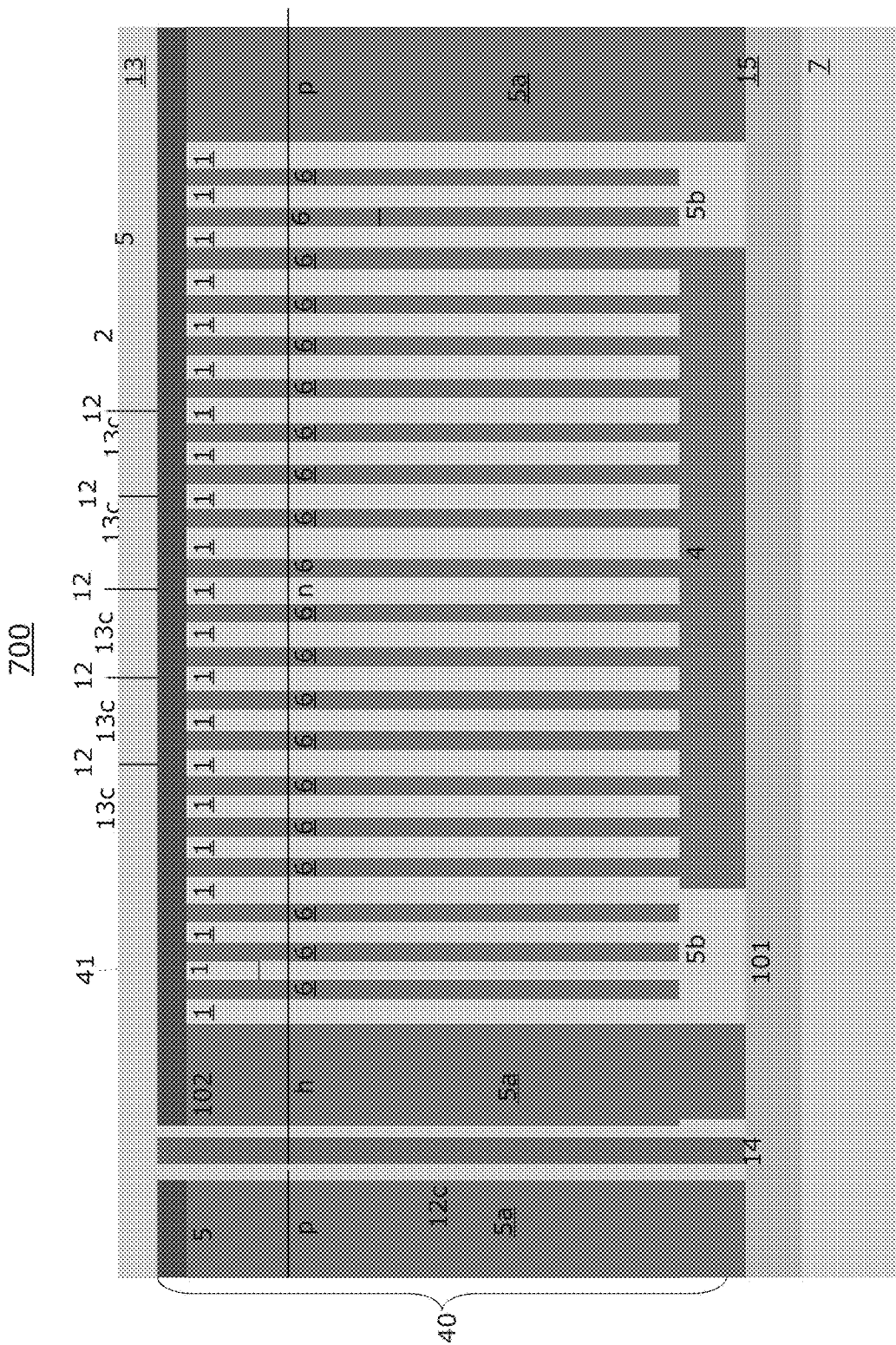

Thereafter, a second dielectric layer 13 may be formed on the second side 102. Forming the second dielectric layer 13 typically includes depositing a dielectric layer. The resulting semiconductor structure 700 is illustrated in FIG. 16.

Thereafter, shallow trenches 53 may be etched through the second dielectric layer 13.

Figure 17:
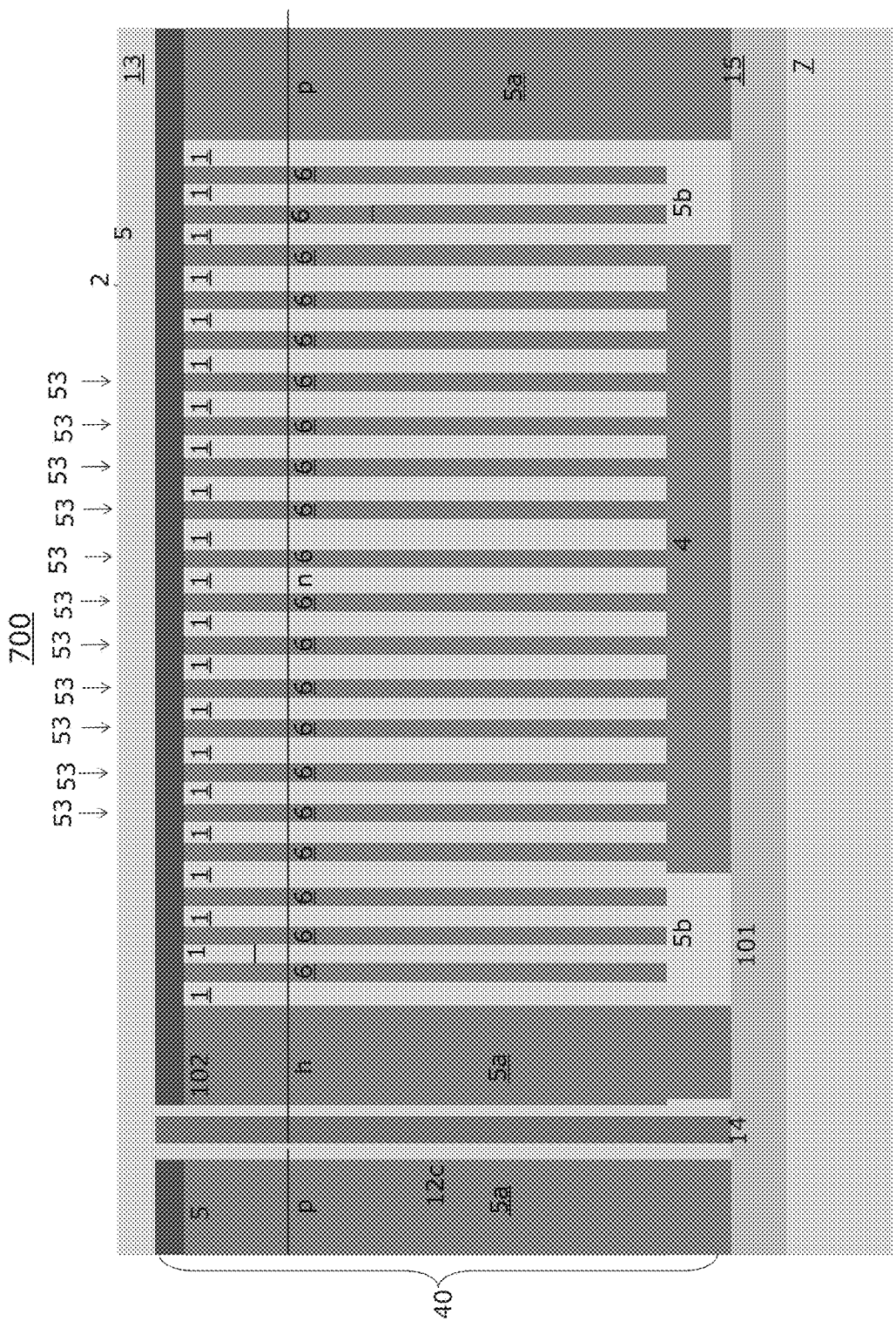

As illustrated in FIG. 17, the shallow trenches 53 may extend into the compensation regions 6.

Thereafter, the shallow trenches 53 may be filled with a conductive material such as doped poly-Si to form source contacts 10c.

Figure 18:
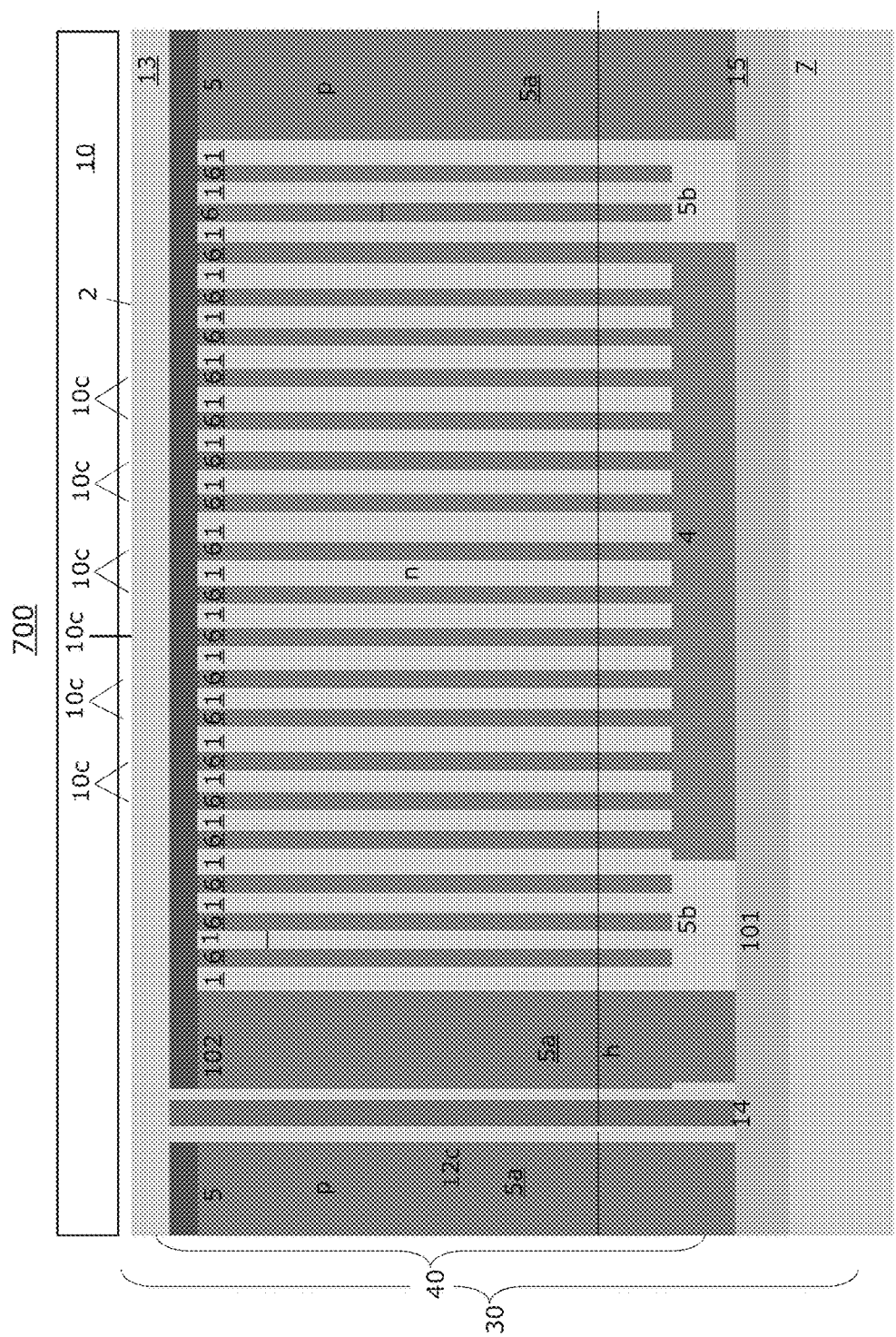

After subsequent forming a first metallization 10, typically forming a source metallization, on the dielectric layer 13 (on the second side 102), device processing from the second side 102 may be finished. Forming the first metallization 10 typically includes depositing a highly conductive material. The resulting semiconductor structure 700 is illustrated in FIG. 18.

Thereafter, the wafer 30 may be mounted upside down.

Figure 19:
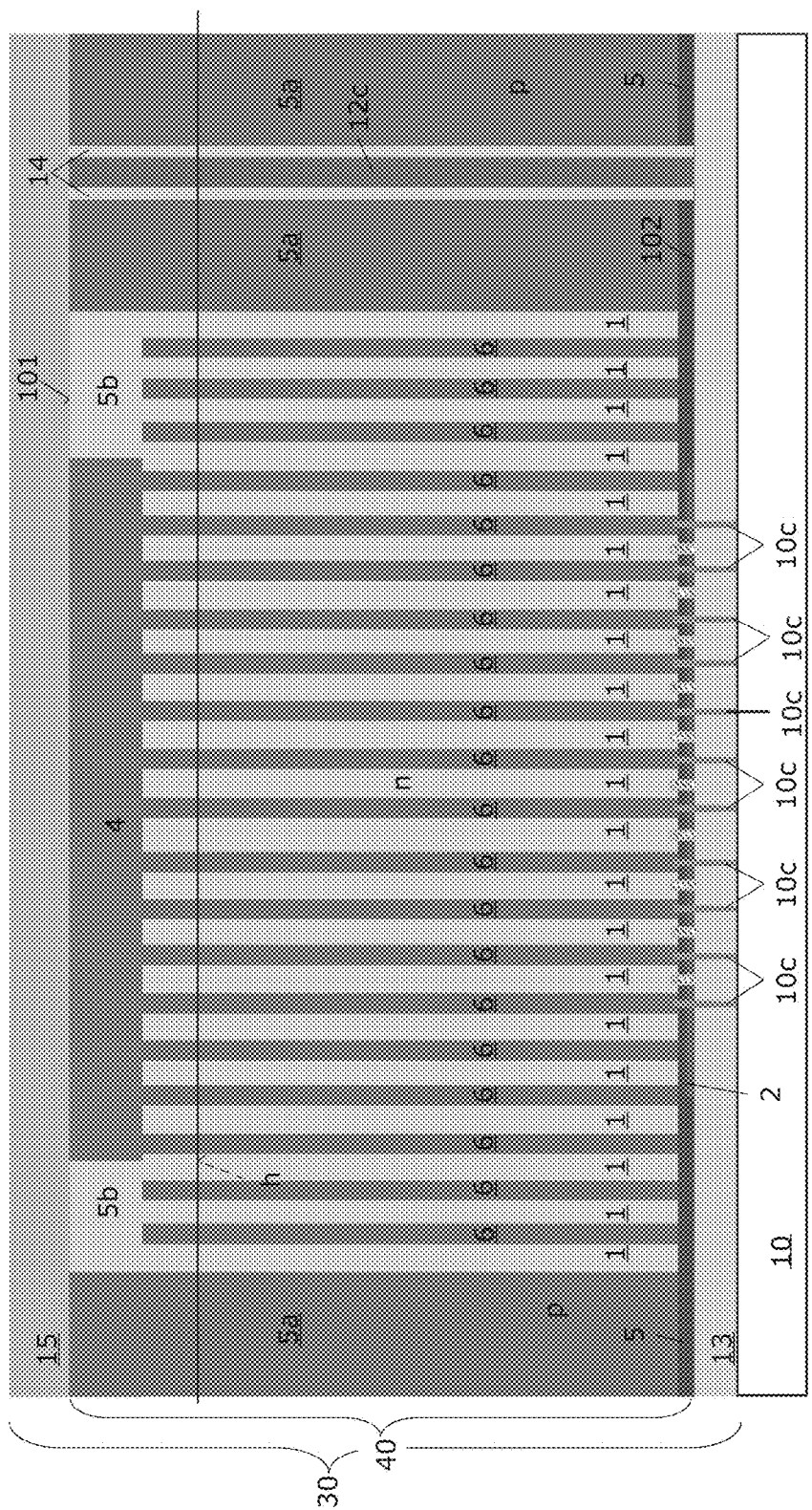

FIG. 19 illustrates the resulting semiconductor structure 700 after further removing the semiconductor layer 7. This may be achieved by grinding.

Alternatively, the semiconductor layer 7 is only partly removed (thinned).

Thereafter, masked etching may be used to form a first opening 17 in the first dielectric layer 15 in the active area and a second opening 18 in the first dielectric layer 15 in the peripheral area.

Figure 20:
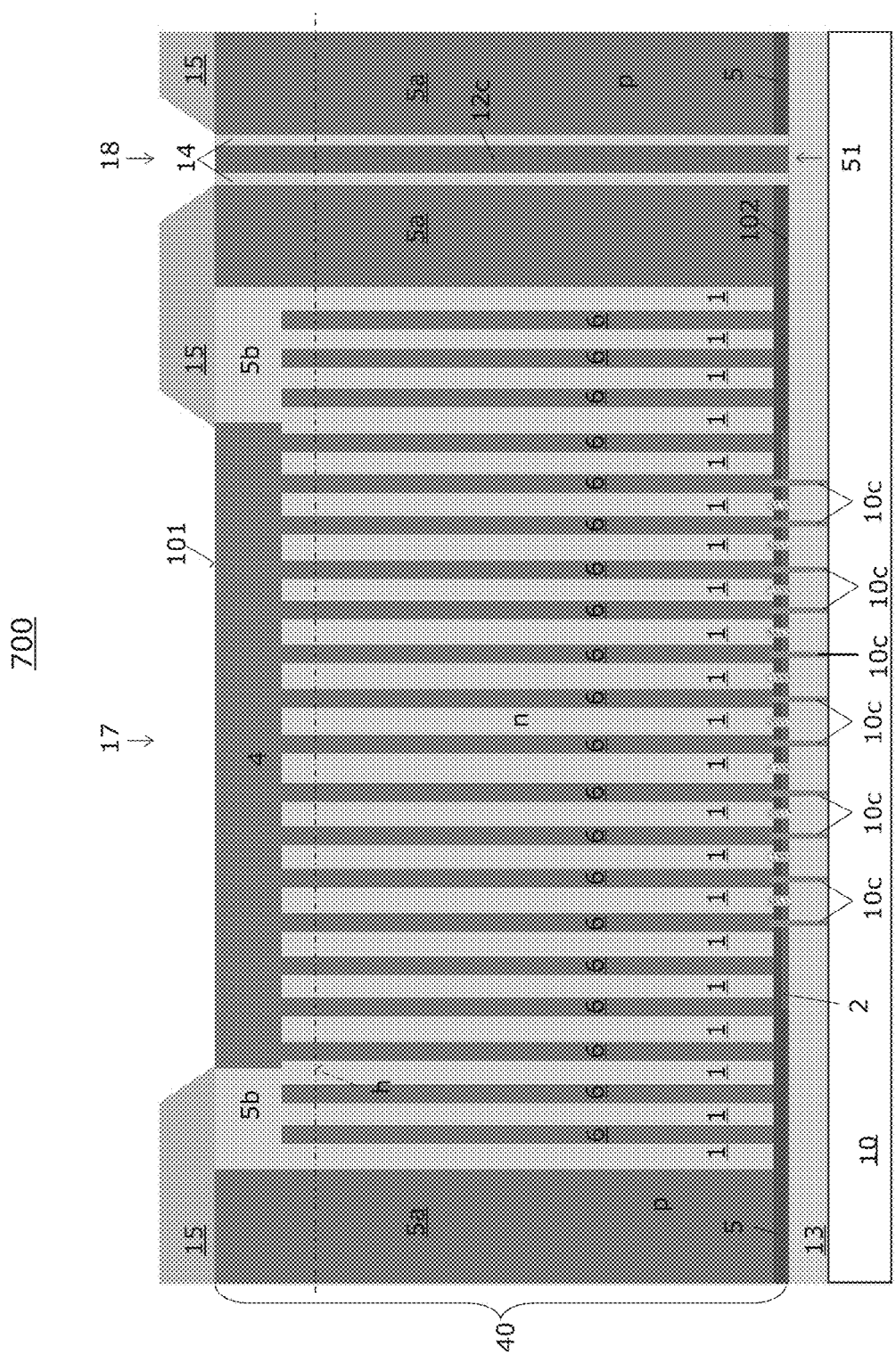

As illustrated in FIG. 20, the first opening 17 exposes the semiconductor body 40 at the first side 101.

Further, the second opening 18 exposes the conductive region 12c of the first deep trench 51 at the first side 101.

Forming the second opening 18 in the dielectric layer 15 can be omitted if the conductive region 12c extends through the dielectric layer 15 as explained above with regard to FIG. 14. In these embodiments, a larger process variability for forming the first opening 17 is tolerable.

Thereafter, a conductive layer may be deposited on the first side 101.

Further, the conductive layer may be etched using a mask to form a second metallization 11 (typically a drain metallization) and a gate metallization 12a, 12p on the first side 101.

Thereafter, the wafer 30 may be separated, e.g. by sawing along sawing or scribe lines 41, into individual charge-compensation semiconductor devices, so that the charge-compensation semiconductor devices have a corresponding lateral edge 41 which delimits the charge-compensation semiconductor device 700 in a horizontal direction substantially parallel to the first side 101.

Figure 21:
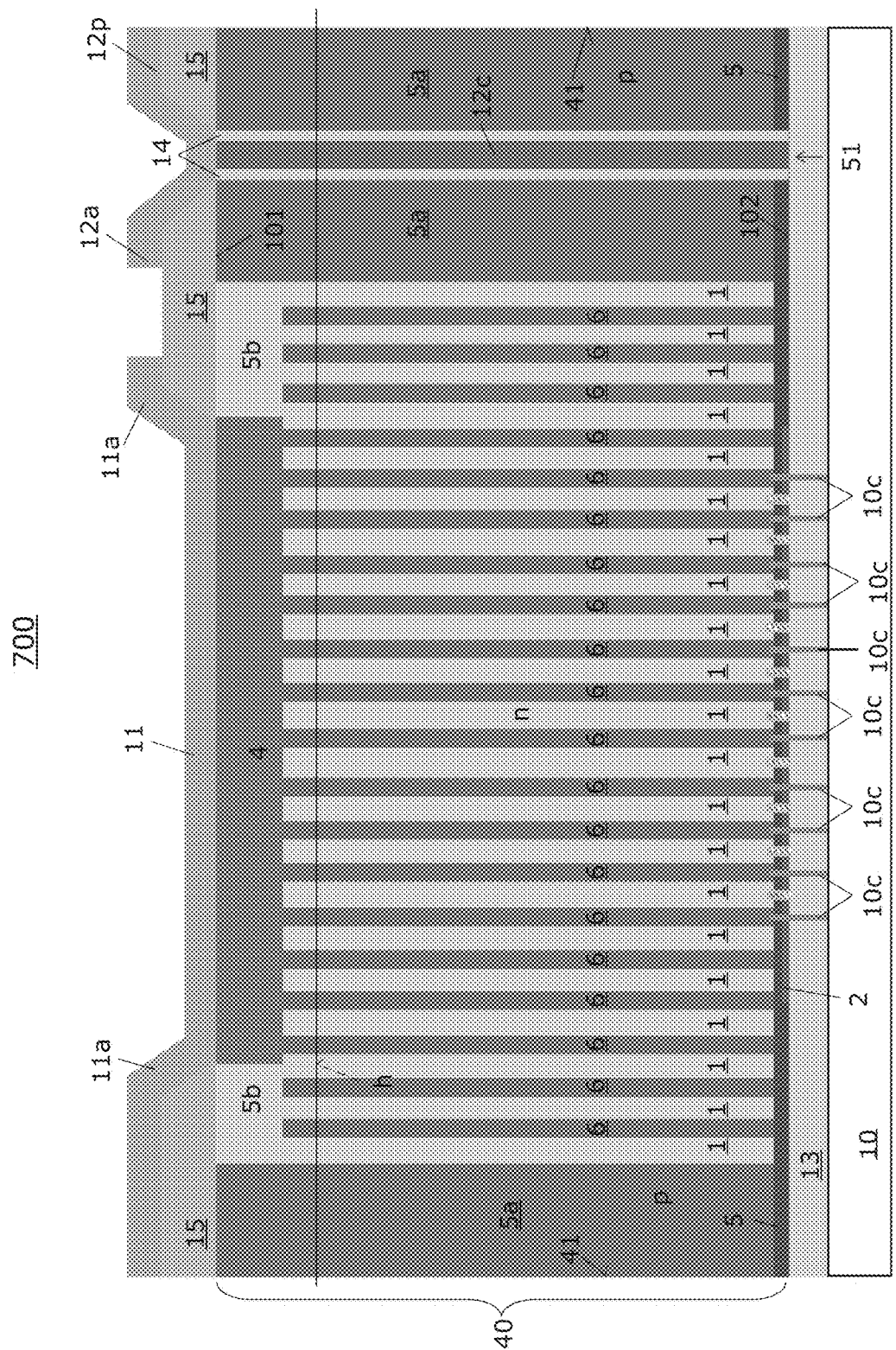

After further separating the wafer 30 into individual chis, charge-compensation semiconductor devices 700 as illustrated in FIG. 21 may be obtained.

Figure 22:
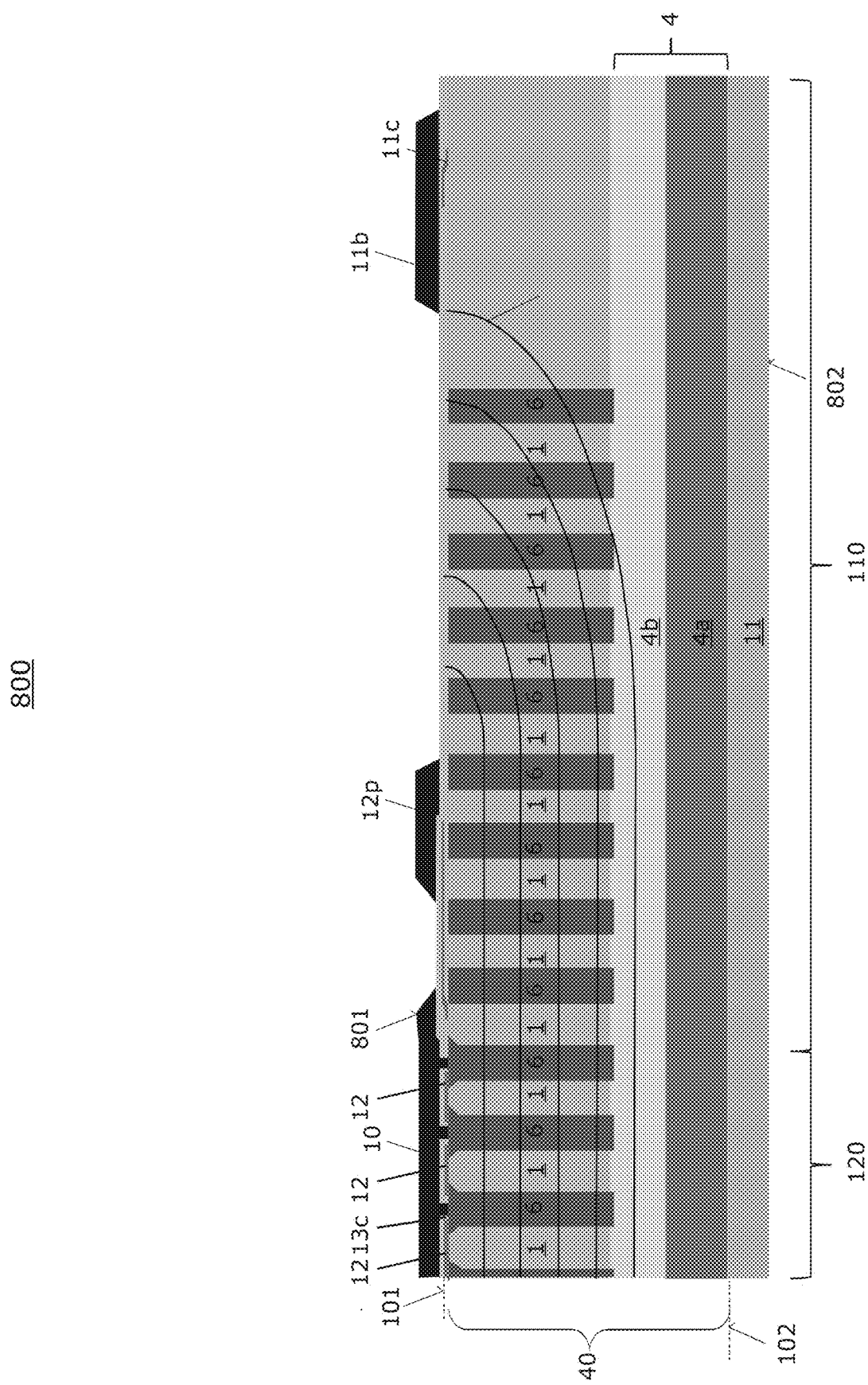
FIG. 22 illustrates a vertical cross-section through a semiconductor body of a drain-down configured field-effect semiconductor device according to an embodiment.

With reference to FIG. 22, an embodiment of a field-effect semiconductor device 800 is explained. The field-effect semiconductor device 800 of FIG. 8 differs from the previously described field-effect semiconductor devices with respect to the orientation of the source and drain terminals of the device. Whereas the previously described field-effect semiconductor devices are configured as source-down devices, the field-effect semiconductor device 800 of FIG. 8 has a drain-down configuration. This means that the drain terminal of the device is disposed on the second side 102 of the semiconductor body 40 (i.e., the back side of the substrate). In this case, the drain metallization 11, which is formed on the second side 102 of the semiconductor body 40, provides a drain terminal at a rear outer surface 802 of the field-effect semiconductor device 800.

The semiconductor body 40 of the field-effect semiconductor device 800 includes the mono-crystalline drift regions 1 as previously described. In the exemplary embodiment, drift regions 1 are n-type, i.e. doped with n-type dopants. The semiconductor body 40 of the field-effect semiconductor device 800 additionally includes compensation regions 6 as previously described. The compensation regions 6 are in Ohmic connection with a source metallization 10, which is disposed at the first side 102 of the semiconductor body 40 (i.e., the front side of the substrate). The source metallization 10 provides a source terminal at a main outer surface 801 of the field-effect semiconductor device 800. In this example, the compensation regions 6 provide the body regions of the device. The semiconductor body 40 additionally includes an n-type drain- and field-stop layer 4 including a field-stop region 4b having a higher doping concentration than the drift region 1, and a drain region 4a having a higher doping concentration than the field-stop region 4b and arranged between the field-stop layer 4b and the drain metallization 11.

In the active area 120, a plurality of gate electrodes 12 is disposed on the first side 101 of the semiconductor body 40. The gate electrodes 12 are electrically insulated from the semiconductor body 40 by respective gate dielectric regions 13c. The gate electrodes 12 are electrically connected to a gate metallization 12p, which is formed on the first side 102 of the semiconductor body 40 and provides a gate terminal at the main outer surface 801 of the field-effect semiconductor device 800.

In a conventionally known manner, the gate electrodes 12 are configured to control a conductive channel in the body regions (i.e., the compensation regions 6) for providing low Ohmic connections between the source metallization 10 and the drift region 1, and thus between the source metallization 10 and the drain metallization 11 in a forward mode of the field-effect semiconductor device 100. In embodiments referring to a p-channel MOSFET, the doping relations are reversed.

In the exemplary embodiment, the gate electrodes 12 are implemented as planar electrode structures, meaning that they are disposed on and laterally extend across the first side 101. Alternatively, the gate electrodes 12 may be implemented as trench gate electrodes, i.e. as electrodes that are arranged in respective trenches extending from the first side 101 through a body region and into the drift region 1.

In the peripheral area 110, a second drain metallization 11*b* is provided on the first side 101 of the semiconductor body 40. The second drain metallization 11*b* is electrically connected to a field plate 11*c*. The field plate 11*c* can be set at the drain potential, i.e., the same potential as the drain metallization 11, so as to divert the electric field lines 25 away from the edge of the substrate in the previously described manner.

Figure 23:
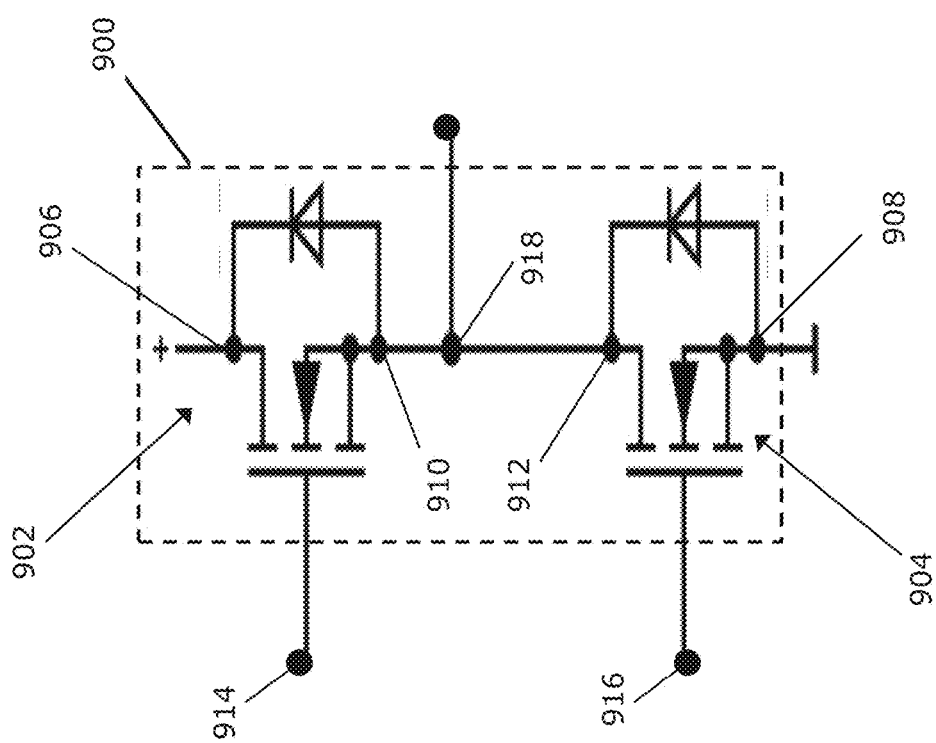
FIG. 23 illustrates a schematic of a half-bridge circuit according to an embodiment.

With reference to FIG. 23, a half-bridge circuit 900 is schematically depicted, according to an embodiment. The half-bridge circuit 900 includes a high-side switch 902 and a low-side switch 904. The drain terminal 906 of the high-side switch 902 is electrically connected to a high potential (e.g., +5V) and the source terminal 908 of the low-side switch 904 is electrically connected to a low potential (e.g., −5V). The source terminal 910 of the high-side switch 902 is electrically connected to the drain terminal 912 of the low-side switch 904. The gate terminals of the high-side and low-side switches 902, 904 are each independently controllable via input terminals 914, 916 of the half bridge circuit 900.

The working principle of the half-bridge circuit 900 is as follows. The half-bridge circuit 900 is configured as a so-called "switched-mode" power converter, which is configured to convert power from one format to another, e.g., DC to AC conversion, AC to AC voltage step down, etc., by appropriate switching of the switching elements. The converted power is provided at a center tap node 918 of the half-bridge circuit 900, i.e., a node which connects the source terminal 910 of the high-side switch 902 and the drain terminal 912 of the low-side switch 904. In one example, the half-bridge circuit 900 can be configured to generate a square wave at the center tap node 918. By turning the high-side switch 902 ON with the low-side switch 904 being OFF, the center tap node 918 is pulled up to the high potential. Likewise, by turning the low-side switch 904 ON with the high-side switch 902 being OFF, the center tap node 918 is pulled down to the low potential.

While n-channel MOSFET devices are shown in the depicted example, more generally, the half-bridge circuit 900 can include other types of switching devices e.g., p-channel MOSFETs, IGBTs, etc.

Figure 24:
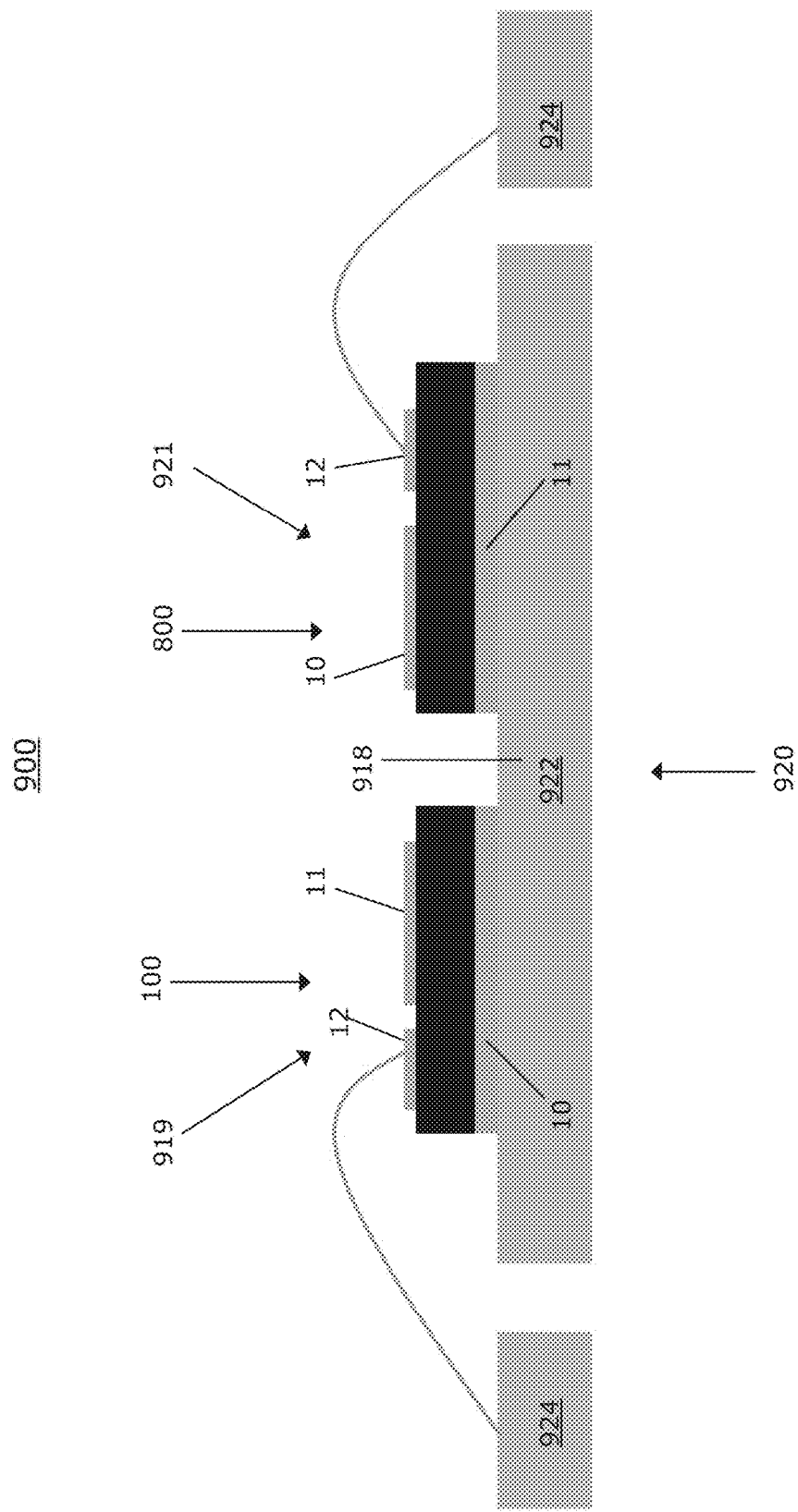
FIG. 24 illustrates a half-bridge circuit that includes two discrete field-effect semiconductor devices mounted on a lead frame, according to an embodiment.

With reference to FIG. 24, a package implementation of the half-bridge circuit 900 described with reference to FIG. 23 is depicted, according to an embodiment. In this assembly, first and second integrated switching devices 919, 921 and a lead frame 920 collectively provide the half-bridge circuit 900 as described with reference to FIG. 23. In this example, the first integrated switching device 919 is provided by the field-effect semiconductor device 100 described with reference to FIG. 1 and the second integrated switching device 921 is provided by the field-effect semiconductor device 800 described with reference to FIG. 22. More generally, the first integrated switching device 919 can be provided by any of the source-down configured switching devices described herein, i.e., any of the devices described with reference to FIGS. 1-21.

The assembly of FIG. 24 includes an electrically conductive lead frame 920 having a die pad 922 and a plurality of electrically conductive leads 924, with each of the leads 924 in the plurality being spaced apart from one another and from the die pad 922. Generally speaking, the die pad 922 and the leads 924 can be formed from any of a wide variety of electrically conductive materials, including copper, aluminium, and alloys thereof.

The source terminal of the first integrated switching device 919, which is provided by the source metallization 10, faces and electrically connects with the die pad 922. This electrical connection can be provided by direct physical contact or a conductive intermediatry, e.g., solder, conductive glue, etc. Likewise, the drain terminal of the second integrated switching device 921, which is provided by the drain metallization 11, faces and electrically connects with the die pad 922 in a corresponding manner.

Advantageously, the die pad 922 portion of the lead frame 920 provides the center tap node 918 of the half-bridge circuit 900. Due to the source-down configuration of the first integrated switching device 919 and the drain-down configuration of the second integrated switching device 921, a direct, low-resistance electrical connection between the downward facing terminals of these devices is provided by the die pad 922. As a result, the center tap node 918 of this half-bridge circuit 900 has improved parasitic effects (e.g., resistance, inductance, etc.) and can be formed more reliably in comparison to conventional configurations that utilize one or more bond wires to provide a center tap node.

Figure 25B:
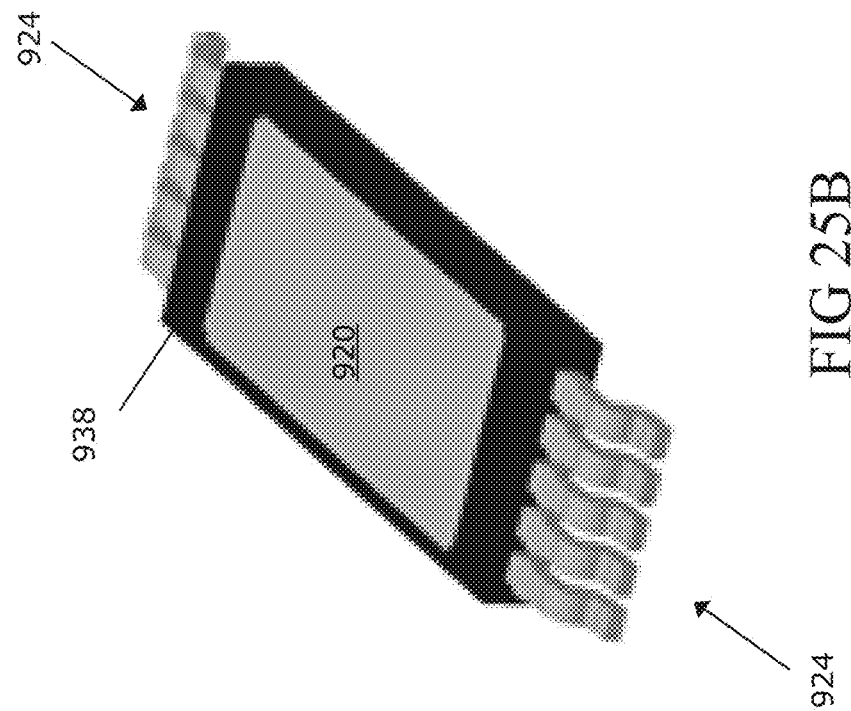
FIGS. 25A and 25B, illustrates a packaged half-bridge circuit, according to an embodiment.
Figure 25A:
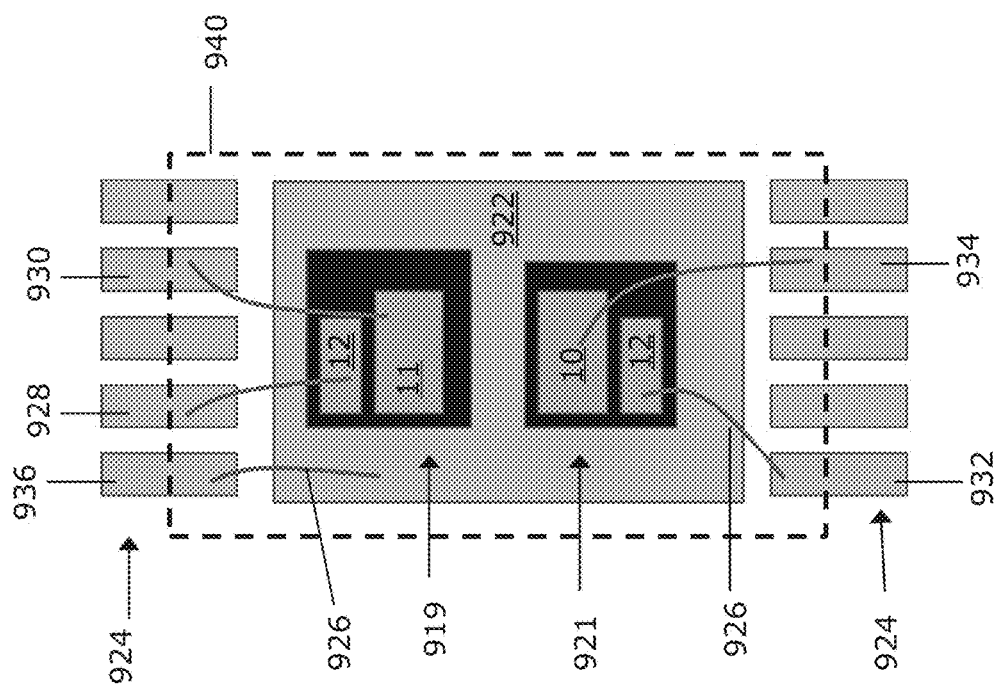

With reference to FIG. 25A, the package implementation includes a number of electrically conductive bond wires 926 that provide the necessary electrical connections to complete the half-bridge circuit 900 as described with reference to FIG. 23. In particular, a first bond wire 926 electrically connects the gate terminal of the first integrated switching device 919 (i.e., the gate metallization 12) with a first one 928 of the package leads 924. Hence, the first one 928 of the package leads 924 provides the first input terminal 914 of the half-bridge circuit 900. A second bond wire 926 electrically connects the drain terminal of the first integrated switching device 919 (i.e., the drain metallization 11) with a second one 930 of the package leads 924. Hence, the second one 930 of the package leads 924 provides the high potential terminal of the half-bridge circuit 900. A third bond wire 926 electrically connects the gate terminal of the second integrated switching device 921 (i.e., the gate metallization 12) with a third one 932 of the package leads 924. Hence, the third one 932 of the package leads 924 provides the second input terminal 916 of the half-bridge circuit 900. A fourth bond wire 926 electrically connects the source terminal of the second integrated switching device 921 (i.e., the source metallization 10) with a fourth one 934 of the package leads 924. Hence, the fourth one 934 of the package leads 924 provides the low potential terminal of the half-bridge circuit 900. A fifth bond wire 926 electrically connects the die pad 922 to a fifth one 936 of the package leads 924. Hence, the fifth one 936 of the package leads 924 provides an electrical connection to the center tap node 918 of the half bridge circuit. Each of these bond wires 926 can be attached and electrically connected in the above described manner using a solder material, for example. More generally, any of a variety of electrical connection techniques can be utilized to effectuate these electrical connections including, e.g., conductive clips, PCB, ribbons, etc.

With reference to FIG. 25B, a completed package is shown after encapsulation of the semiconductor dies. The completed package includes an electrically insulating mold compound 938 which is formed around the first and integrated switching devices according to the package outline 940 shown in FIG. 25A. The mold compound 938 can include a wide variety of electrically insulating materials that are suitable for semiconductor packaging. Examples of these materials include thermoset materials or thermoplastic materials, to name a few. In this example, a lower side of the die pad 922 is exposed from the mold compound 938. This enables efficient cooling of the device by the mounting the exposed lower side of the die pad 922 on a heat sink.

The package type depicted in FIGS. 24-25 25 is a so-called "surface mount" package, wherein the package is configured to be mounted on a flat surface (e.g., a PCB) with the leads 924 bending to the connection side (i.e., the lower side of the package) to reach the surface. This is just one example of a variety of different package types for packaging the half-bridge circuit 900 wherein a lead frame provides the center tap node 918. Other suitable package types include a so-called TO (transistor outline) package, a so-called DIP (dual in-line package), so-called QFP (quad-flat-package), and a so-called BGA (ball grid array) package, to name a few.

In an embodiment that can be combined with others, a semiconductor device comprises an electrically conductive lead frame 920 which comprises a die pad 922 and a plurality of electrically conductive leads 924, each of the leads 924 in the plurality being spaced apart from the die pad 922. The semiconductor device further includes first and second integrated switching devices 919, 921 mounted on the die pad 922, wherein each of the first and second integrated switching devices 919, 921 include electrically conductive gate, source and drain terminals. The source terminal of the first integrated switching device 919 is disposed on a rear surface of the first integrated switching device 919 that faces and electrically connects with the die pad 922. The drain terminal of the second integrated switching device 921 is disposed on a rear surface of the second integrated switching device 921 that faces and electrically connects with the die pad 922.

In an embodiment that can be combined with others, the gate and drain terminals of the first integrated switching device 921 are disposed on a main surface of the first integrated switching device 919 that is opposite from the die pad 922. The first integrated switching device comprises a first semiconductor body 40. The first semiconductor body 40 includes a first side 101 that is opposite from the die pad 922, a second side 102 that faces the die pad 922, a drift region 1, a gate electrode 12 disposed at the second side 102 and being configured to provide an electrically conductive connection between the source terminal and the drift region 1, and a first through contact structure 12c extending between the first and second sides 101, 102 of the first semiconductor body 40 and comprising a conductive region 12c in Ohmic connection with the gate electrode 12 and the gate terminal.

In an embodiment that can be combined with others, the first semiconductor body 40 further comprises a field stop region 4 having an opposite conductivity type as the drift region 1, and the field stop region 4 laterally surrounds at least one of the drift region 1 and the gate electrode 12 in a horizontal direction of the first semiconductor body 40 that is parallel to the first side of the first semiconductor body 40.

In an embodiment that can be combined with others, the first semiconductor body 40 further comprises a plurality of compensation regions 6, each of the compensation regions 6 adjoining the body region 5 and forming a respective pn-junction with the drift region 1, and the field stop region 4 laterally surrounds the compensation regions 6 in the horizontal direction.

In an embodiment that can be combined with others, at least a portion of the field-stop region 4 is, in the horizontal direction, arranged between the first through contact structure 12c and at least one of the drift region 1 and the gate electrode 12.

In an embodiment that can be combined with others, the gate and source terminals of the second integrated switching device 921 are disposed on a main surface of the second integrated switching device 921 that is opposite from the die pad 922. The second integrated switching device comprises a second semiconductor body 40. The second semiconductor body 40 comprises a first side 101 that is opposite from the die pad 922, a second side 102 that faces the die pad 922, a drift region 1, a body region 5 that forms a p-n junction with the drift region 1, and a gate electrode 12 disposed at the first side and being configured to provide an electrically conductive connection between the source terminal and the drift region 1.

In an embodiment that can be combined with others, the second semiconductor body 40 further comprises a field stop region 4 having an opposite conductivity type as the drift region 1, and the field stop region 4 laterally surrounds at least one of the drift region 1 and the gate electrode 12 in a horizontal direction of the second semiconductor body 40 that is parallel to the first side of the semiconductor body 40.

In an embodiment that can be combined with others, a semiconductor device comprises an electrically conductive lead frame 920 which includes a die pad 922 and a plurality of electrically conductive leads 924, each of the leads 924 in the plurality being spaced apart from the die pad 922. The semiconductor device further includes a half bridge circuit 900 comprising a high-side switch 902, a low-side switch 904, and a center tap node 918 connected between a drain terminal 906 of the high-side switch 902 and a source terminal 908 of the low-side switch 904. The high-side switch 902 and the low-side switch 904 are each provided by discrete semiconductor dies being mounted on the die pad 922. The die pad 922 provides the center tap node 918 of the half bridge circuit.

In an embodiment that can be combined with others, the high-side switch 902 comprises a first semiconductor body 40 having a first side 101 that is opposite from the die pad 922 and a second side 102 that faces the die pad 922, and the first semiconductor body 40 comprises a gate electrode 12 disposed at the second side 102 and a first through contact structure 12c in ohmic contact with the gate electrode 12 extending between the first and second sides 101, 102 of the first semiconductor body 40.

In an embodiment that can be combined with others, the first semiconductor body 40 further comprises a drift region 1 and a field stop region 4 having an opposite conductivity type as the drift region 1, and the field stop region 4 laterally surrounds at least one of the drift region 1 and the gate electrode 12 in a horizontal direction of the first semiconductor body 40 that is parallel to the first side of the first semiconductor body 40.

In an embodiment that can be combined with others, the first semiconductor body 40 further comprises a plurality of compensation regions 6, each of the compensation regions 6 adjoining forming a respective pn-junction with the drift region 1 in the first semiconductor body 40, and the field stop region 4 laterally surrounds the compensation regions 6 in the horizontal direction.

In an embodiment that can be combined with others, at least a portion of the field-stop region 4 of the first semiconductor body 40 is, in the horizontal direction, arranged between the first through contact structure 12c of the first semiconductor body 40 and at least one of the drift region 1 and the gate electrode 12 of the first semiconductor body 40.

In an embodiment that can be combined with others, the low-side switch 904 comprises a second semiconductor body 40 having a first side 101 that is opposite from the die pad 922 and a second side 102 that faces the die pad 922, and the second semiconductor body 40 comprises a gate electrode 12 disposed at the first side 101 of the second semiconductor body 40 and a drain region disposed at the second side 102 of the second semiconductor body 40.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    an electrically conductive lead frame comprising a die pad and a plurality of electrically conductive leads, each of the leads in the plurality being spaced apart from the die pad; and
    first and second integrated switching devices mounted on the die pad, each of the first and second integrated switching devices comprising electrically conductive gate, source and drain terminals,
    wherein the source terminal of the first integrated switching device is disposed on a rear surface of the first integrated switching device that faces and electrically connects with the die pad, and
    wherein the drain terminal of the second integrated switching device is disposed on a rear surface of the second integrated switching device that faces and electrically connects with the die pad,
    wherein the gate and drain terminals of the first integrated switching device are disposed on a main surface of the first integrated switching device that is opposite from the die pad,
    wherein the first integrated switching device comprises a first semiconductor body,
    wherein the first semiconductor body comprises:
        a first side that is opposite from the die pad;
        a second side that faces the die pad;
        a drift region;
        a body region that forms a p-n junction with the drift region;
        a gate electrode disposed at the second side and being configured to provide an electrically conductive connection between the source terminal and the drift region; and
        a first through contact structure extending between the first and second sides of the first semiconductor body and comprising a conductive region in Ohmic connection with the gate electrode and the gate terminal.

2. The semiconductor device of claim 1, wherein the first semiconductor body further comprises a field stop region having an opposite conductivity type as the drift region, wherein the field stop region laterally surrounds at least one of the drift region and the gate electrode in a horizontal direction of the first semiconductor body that is parallel to the first side of the first semiconductor body.

3. The semiconductor device of claim 2, wherein the first semiconductor body further comprises a plurality of compensation regions, each of the compensation regions adjoining the body region and forming a respective pn-junction with the drift region, wherein the field stop region laterally surrounds the compensation regions in the horizontal direction.

4. The semiconductor device of claim 2, wherein at least a portion of the field-stop region is, in the horizontal direction, arranged between the first through contact structure and at least one of the drift region and the gate electrode.

5. The semiconductor device of claim 1, wherein the gate and source terminals of the second integrated switching device are disposed on a main surface of the second integrated switching device that is opposite from the die pad, wherein the second integrated switching device comprises a second semiconductor body, wherein the second semiconductor body comprises:
    a first side that is opposite from the die pad;
    a second side that faces the die pad;
    a drift region;
    a body region that forms a p-n junction with the drift region; and
    a gate electrode disposed at the first side and being configured to provide an electrically conductive connection between the source terminal and the drift region.

6. The semiconductor device of claim 5, wherein the second semiconductor body further comprises a field stop region having an opposite conductivity type as the drift region, wherein the field stop region laterally surrounds at least one of the drift region and the gate electrode in a horizontal direction of the second semiconductor body that is parallel to the first side of the semiconductor body.

7. A semiconductor device, comprising:
    an electrically conductive lead frame comprising a die pad and a plurality of electrically conductive leads, each of the leads in the plurality being spaced apart from the die pad;
    a half-bridge circuit comprising a high-side switch, a low-side switch, and a center tap node connected between a drain terminal of the high-side switch and a source terminal of the low-side switch,
    wherein the high-side switch and the low-side switch are each provided by discrete semiconductor dies being mounted on the die pad, and
    wherein the die pad provides the center tap node of the half-bridge circuit, wherein the high-side switch comprises a first semiconductor body having a first side that is opposite from the die pad and a second side that faces the die pad, wherein the first semiconductor body comprises a gate electrode disposed at the second side and a first through contact structure in ohmic contact with the gate electrode extending between the first and second sides of the first semiconductor body.

8. The semiconductor device of claim 7, wherein the first semiconductor body further comprises a drift region and a field stop region having an opposite conductivity type as the drift region, wherein the field stop region laterally surrounds at least one of the drift region and the gate electrode in a horizontal direction of the first semiconductor body that is parallel to the first side of the first semiconductor body.

9. The semiconductor device of claim 8, wherein the first semiconductor body further comprises a plurality of compensation regions, each of the compensation regions forming a respective pn-junction with the drift region in the first semiconductor body, and wherein the field stop region laterally surrounds the compensation regions in the horizontal direction.

10. The semiconductor device of claim 9, wherein at least a portion of the field-stop region of the first semiconductor body is, in the horizontal direction, arranged between the first through contact structure of the first semiconductor body and at least one of the drift region and the gate electrode of the first semiconductor body.

11. The packaged semiconductor device of claim 7, wherein the low-side switch comprises a second semiconductor body having a first side that is opposite from the die pad and a second side that faces the die pad, wherein the second semiconductor body comprises a gate electrode disposed at the first side of the second semiconductor body and a drain region disposed at the second side of the second semiconductor body.

* * * * *